United States Patent
Eikyu et al.

(10) Patent No.: US 9,437,644 B2
(45) Date of Patent: Sep. 6, 2016

(54) SEMICONDUCTOR DEVICE AND METHOD OF MANUFACTURING SAME

(71) Applicant: RENESAS ELECTRONICS CORPORATION, Kawasaki-shi, Kanagawa (JP)

(72) Inventors: Katsumi Eikyu, Kawasaki (JP); Atsushi Sakai, Kawasaki (JP); Hiroyuki Arie, Kawasaki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/528,724

(22) Filed: Oct. 30, 2014

(65) Prior Publication Data
US 2015/0130009 A1   May 14, 2015

(30) Foreign Application Priority Data
Nov. 8, 2013 (JP) .................................. 2013-232371

(51) Int. Cl.
H01L 27/146 (2006.01)
H01L 31/028 (2006.01)
H01L 31/18 (2006.01)

(52) U.S. Cl.
CPC ..... *H01L 27/14645* (2013.01); *H01L 27/1463* (2013.01); *H01L 27/14609* (2013.01); *H01L 27/14689* (2013.01); *H01L 31/028* (2013.01); *H01L 31/1804* (2013.01)

(58) Field of Classification Search
CPC .............. H01L 27/14645; H01L 27/14609; H01L 27/1463; H01L 27/14689; H01L 31/028; H01L 31/1804
USPC .......................................... 257/440; 438/462
See application file for complete search history.

(56) References Cited

U.S. PATENT DOCUMENTS

| 7,427,530 B2 * | 9/2008 | Bae ................. H01L 31/103 257/466 |
| 7,449,712 B2 | 11/2008 | Cha |
| 7,705,380 B2 | 4/2010 | Yamaguchi et al. |
| 7,928,478 B2 | 4/2011 | Hynecek |
| 2001/0038096 A1 * | 11/2001 | Fukushima ......... H01L 31/103 257/53 |
| 2006/0157806 A1 * | 7/2006 | Rhodes ............ H01L 27/14609 257/414 |
| 2006/0163618 A1 * | 7/2006 | Park ................. H01L 27/14627 257/221 |

(Continued)

FOREIGN PATENT DOCUMENTS

| JP | 2007-013177 A | 1/2007 |
| JP | 2008-091781 A | 4/2008 |
| JP | 2008-098601 A | 4/2008 |

*Primary Examiner* — Karen Kusumakar
*Assistant Examiner* — Adam S Bowen
(74) *Attorney, Agent, or Firm* — McDermott Will & Emery LLP

(57) ABSTRACT

To provide a semiconductor device having a photoelectric conversion element having a high sensitivity, causing less blooming, and capable of providing a highly reliable image. The semiconductor device has a semiconductor substrate, a first p type epitaxial layer, a second p type epitaxial layer, and a first photoelectric conversion element. The first p type epitaxial layer is formed over the main surface of the semiconductor substrate. The second p type epitaxial layer is formed so as to cover the upper surface of the first p type epitaxial layer. The first photoelectric conversion element is formed in the second p type epitaxial layer. The first and second p type epitaxial layers are each made of silicon and the first p type epitaxial layer has a p type impurity concentration higher than that of the second p type epitaxial layer.

20 Claims, 29 Drawing Sheets

(56) References Cited

U.S. PATENT DOCUMENTS

| | | | |
|---|---|---|---|
| 2007/0001164 A1* | 1/2007 | Cha | H01L 27/14601 257/19 |
| 2009/0140367 A1* | 6/2009 | Iwai | H01L 31/10 257/462 |
| 2010/0134668 A1* | 6/2010 | Park | H01L 27/1463 348/294 |
| 2011/0122302 A1* | 5/2011 | Fukunaga | H01L 27/14621 348/273 |
| 2012/0193690 A1* | 8/2012 | Inoue | H01L 27/14607 257/290 |

* cited by examiner

FIG. 15
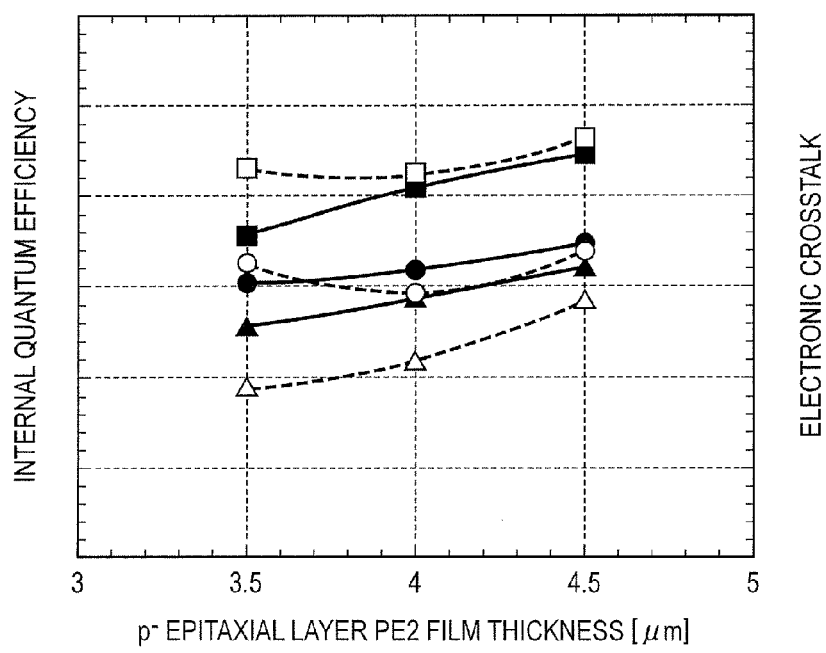
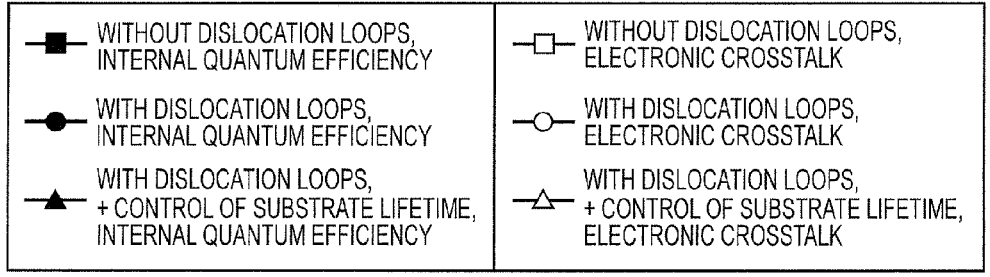

SEMICONDUCTOR DEVICE AND METHOD OF MANUFACTURING SAME

CROSS-REFERENCE TO RELATED APPLICATIONS

The disclosure of Japanese Patent Application No. 2013-232371 filed on Nov. 8, 2013 including the specification, drawings and abstract is incorporated herein by reference in its entirety.

BACKGROUND

The present invention relates to a semiconductor device and a method of manufacturing the device, in particular, a semiconductor device having a photoelectric conversion element and a method of manufacturing the device.

Semiconductor imaging devices such as CCD (charge coupled device) image sensor and CMOS (complementary metal oxide semiconductor) image sensor are required to have a high S/N ratio in order to supply a high image quality. This means that an increase in S (signal) needs a high saturated signal level and a high sensitivity to light signals, while a decrease in N (noise) needs a low dark current value.

In the above-mentioned semiconductor imaging devices, an increase in efficiency of collecting electrons, obtained by photoelectric conversion of an incident light, in a photoelectric conversion element is necessary for enhancing the sensitivity to input signals. Particularly, light signals in a long wavelength region are however likely to penetrate in a pixel region and hard to cause photoelectric conversion, which may deteriorate the efficiency of the photoelectric conversion element to collect the light.

In addition, when the light supplied to one photoelectric conversion element and penetrating deeply in a pixel region is photoelectrically converted when it reaches, for example, a substrate of a semiconductor imaging device, there is a possibility of photoelectrically converted electrons leaking into, for example, another photoelectric conversion element adjacent to the one photoelectric conversion element via the substrate. Also when light signals of a level exceeding the saturated signal level are input, there is a possibility of electrons leaking into another photoelectric conversion element adjacent to the one photoelectric conversion element to which the light signals are input. Such leakage of electrons, that is, so-called blooming, if any, deteriorates the electron detection sensitivity of the one photoelectric conversion element and for detecting excess electrons, increases noise in the detection signal, leading to a reduction in S/N ratio.

A technology for suppressing such a phenomenon is disclosed in, for example, Japanese Unexamined Patent Application Publication No. 2008-91781 (Patent Document 1), Japanese Unexamined Patent Application Publication No. 2007-13177 (Patent Document 2), and Japanese Unexamined Patent Application Publication No. 2008-98601 (Japanese Patent 3).

PATENT DOCUMENTS

[Patent Document 1] Japanese Unexamined Patent Application Publication No. 2008-91781
[Patent Document 2] Japanese Unexamined Patent Application Publication No. 2007-13177
[Patent Document 3] Japanese Unexamined Patent Application Publication No. 2008-98601

SUMMARY

A photoelectric conversion efficiency can be enhanced by increasing the depth of a region in which photoelectric conversion for supplying electrons collectable by a photoelectric conversion element is expected to occur. In each of the above-mentioned patent documents, by forming the above-mentioned region as an epitaxial layer, the depth of the region can be increased compared with that formed by the ion implantation technology. In such a manner, the depth of a region in which photoelectric conversion is expected to occur can be increased. Each of the above-mentioned documents however has the following problem.

In Patent Document 1, an n type semiconductor layer formed on a p type semiconductor substrate has a photoelectric conversion portion. In this case, holes as minor carriers move in the n type semiconductor layer to the photoelectric conversion portion, but the mobility of the holes is smaller than that of electrons and a probability of recombination during moving is high. The sensitivity to electric signals at the photoelectric conversion portion may therefore decrease.

In Patent Document 2, a silicon substrate has thereon a silicon germanium epitaxial layer. Formation of a thin film made of a material different from the substrate may accelerate generation and recombination at the interface therebetween, generate leak current, and deteriorate the S/N ratio of a CMOS image sensor.

In Patent Document 3, only a single p type epitaxial layer is formed on a substrate. In this case, an increase in the depth of the epitaxial layer can improve a conversion ratio of a light incident in the epitaxial layer from a red filter, but there is a possibility of not overcoming another problem, for example, deterioration in a blooming suppressive effect.

Another problem and novel features of the invention will be apparent from the description herein and accompanying drawings.

A semiconductor device according to one embodiment of the invention has a semiconductor substrate, a first p type epitaxial layer, a second p type epitaxial layer, and a first photoelectric conversion element. The semiconductor substrate has, over the main surface thereof, the first p type epitaxial layer. The second p type epitaxial layer covers therewith the first p type epitaxial layer. The second p type epitaxial layer has therein the first photoelectric conversion element. The first and second p type epitaxial layers are each made of silicon and the first p type epitaxial layer has a p type impurity concentration higher than that of the second p type epitaxial layer.

A semiconductor device according to another embodiment has a semiconductor substrate, a buried impurity layer, a p type epitaxial layer, and a first photoelectric conversion element. The semiconductor substrate has therein the buried impurity layer. The buried impurity layer has thereover the p type epitaxial layer. The p type epitaxial layer has therein the first photoelectric conversion element. The buried impurity layer and the p type epitaxial layer are each made of silicon and the buried impurity layer has a p type impurity concentration higher than that of the p type epitaxial layer.

A method of manufacturing a semiconductor device according to one embodiment includes the steps of: providing a semiconductor substrate having a main surface, forming a first p type epitaxial layer over the main surface, forming a second p type epitaxial layer so as to cover the upper surface of the first p type epitaxial layer, and forming a first photoelectric conversion element in the second p type epitaxial layer. The first and second p type epitaxial layers are each made of silicon and the first p type epitaxial layer has a p type impurity concentration higher than that of the second p type epitaxial layer.

According to the one embodiment of the invention, the second p type epitaxial layer enables a photoelectric conversion element to detect electrons, which have been obtained by photoelectric conversion in a deeper region, to drive a first photoelectric conversion element at a high sensitivity and at the same time, the first type epitaxial layer is used as a barrier for reducing blooming. This results in an improvement in an S/N ratio and the image thus obtained has enhanced reliability.

Although in the another embodiment of the invention, the first p type epitaxial layer of the one embodiment is replaced with the buried impurity layer and the second p type epitaxial layer of the one embodiment is replaced with the p type epitaxial layer, the another embodiment essentially has an advantage similar to that of the one embodiment.

In a semiconductor device manufactured using the manufacturing method according to the one embodiment of the invention, the second p type epitaxial layer enables a photoelectric conversion element to detect electrons generated by photoelectric conversion which has occurred in a deeper region to thereby drive a first photoelectric conversion element at a high sensitivity and at the same time, the first type epitaxial layer is used as a barrier for reducing blooming. As a result, it is possible to provide a semiconductor device having an improved S/N ratio and capable of providing a highly reliable image.

BRIEF DESCRIPTION OF THE DRAWINGS

FIG. 15 is a graph showing, by the presence or absence of defects formed in the substrate, the relation among the film thickness of the second p type epitaxial layer, internal quantum efficiency, and electronic crosstalk;

DETAILED DESCRIPTION

The one embodiment will hereinafter be described based on some drawings.

First Embodiment

First, arrangement of element formation regions on the main surface of a semiconductor substrate of a semiconductor device according to the one embodiment will be described referring to FIGS. 1 to 3.

Figure 1:
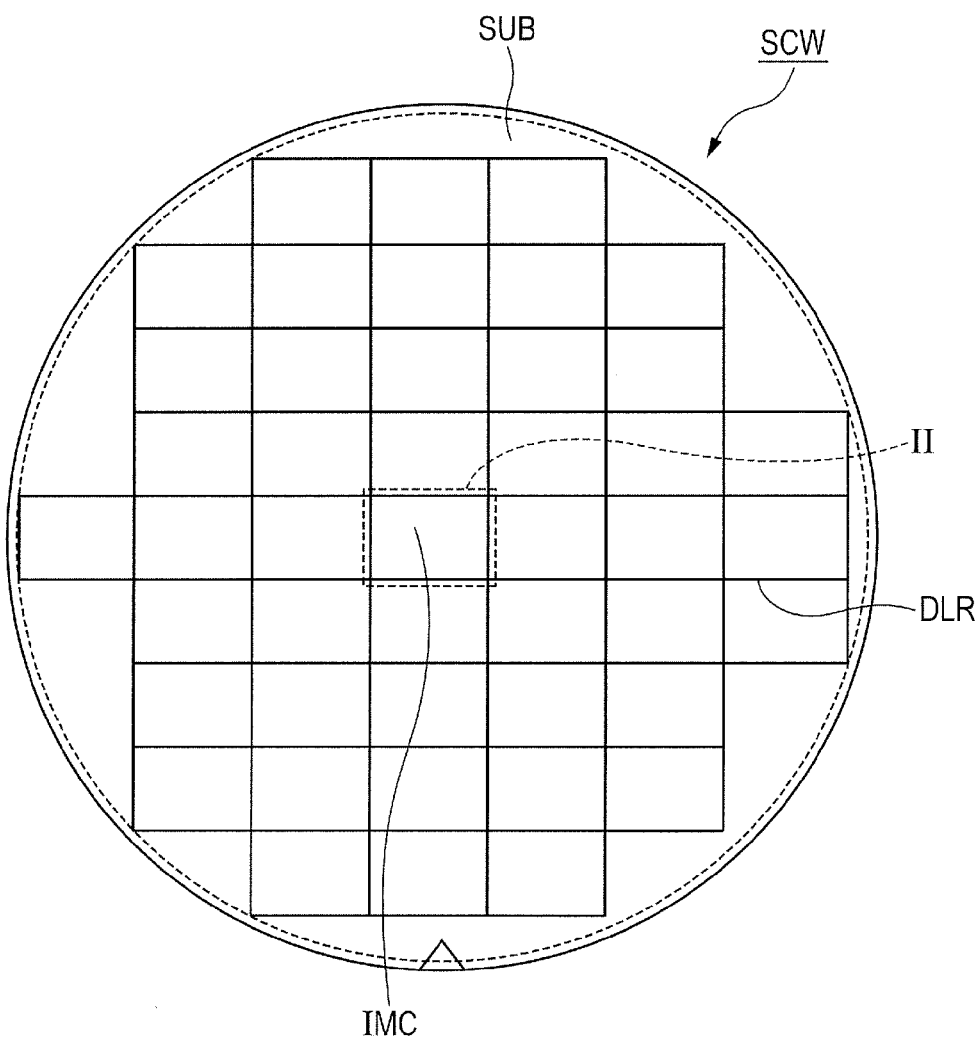
FIG. 1 is a schematic plan view showing, in wafer form, a semiconductor device according to one embodiment.

As FIG. 1 shows, the semiconductor device is formed on a semiconductor wafer SCW having a semiconductor substrate SUB as a base. The semiconductor wafer SCW has a plurality of chip regions IMC in which a plurality of semiconductor imaging devices is to be formed. The chip regions IMC each have a rectangular planar shape and they are arranged in matrix. The chip regions IMC have therebetween a dicing line region DLR.

Figure 2:
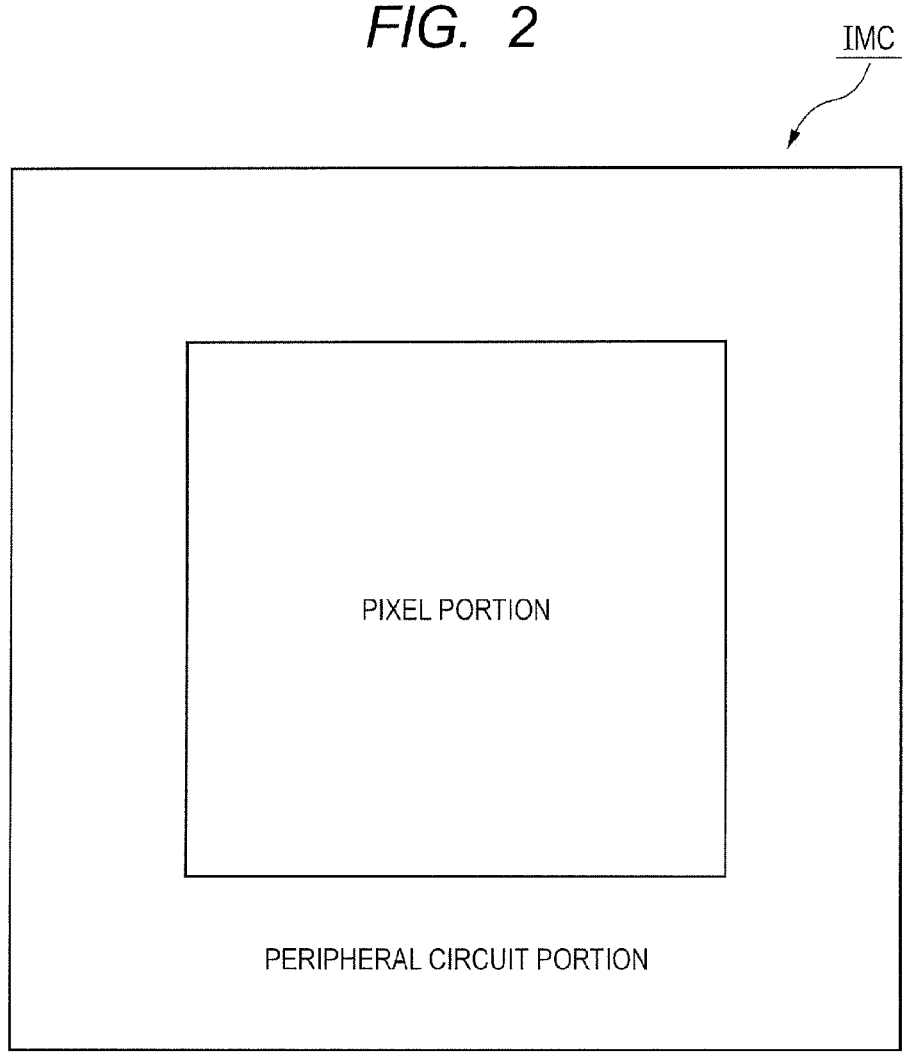
FIG. 2 is a schematic view of the region II enclosed with the dotted line of FIG. 1.

As FIG. 2 shows, the chip regions IMC each have a pixel portion and a peripheral circuit portion. It has the pixel portion at the center of the chip region IMC and the peripheral circuit portion in a region surrounding the pixel portion.

Figure 3:
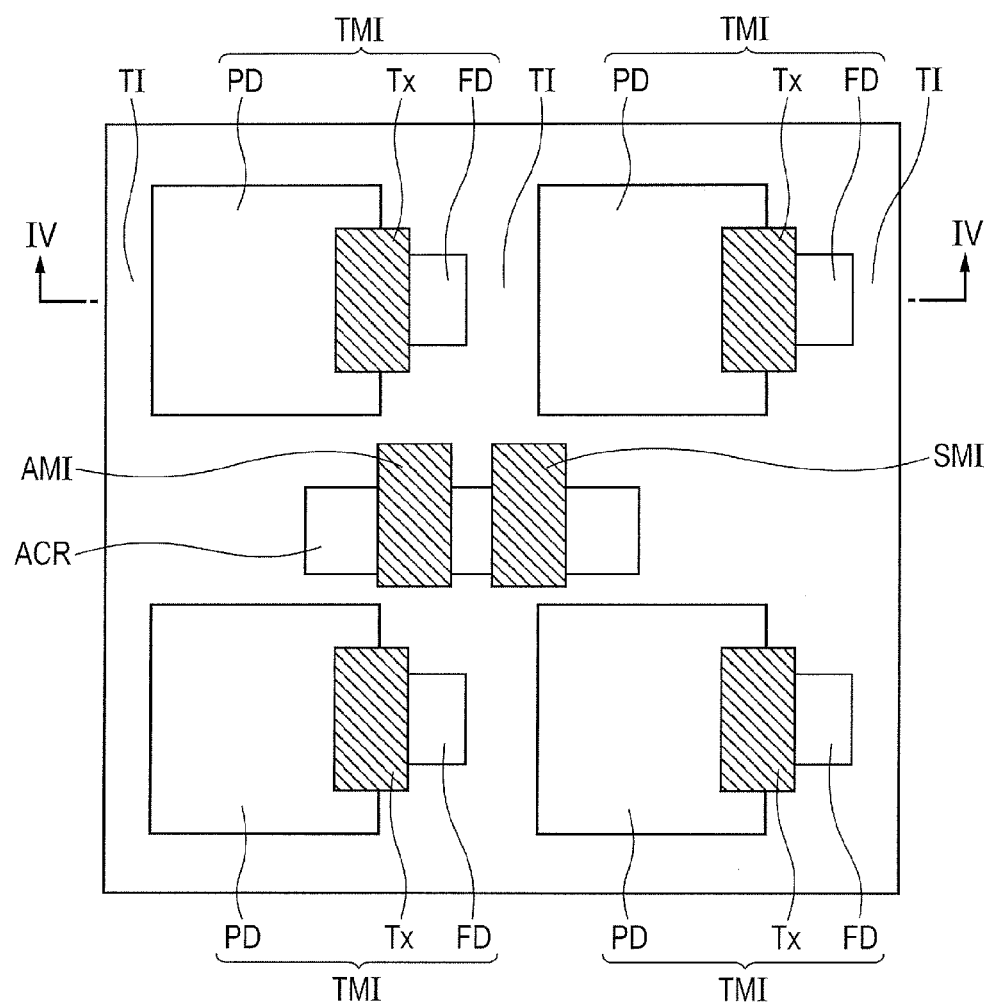
FIG. 3 is a schematic plan view showing the configuration of the pixel portion of FIG. 2.

As FIG. 3 shows, the pixel portion mainly has a transfer transistor TMI, an amplifier transistor AMI, and a select transistor SMI and a plurality of so-called solid imaging devices comprised of them is arranged, for example, in matrix. In FIG. 3, a plurality of transistors TMI is arranged in matrix. Although the number of each of the amplifier transistor AMI and the select transistor SMI arranged is only one, a plurality of amplifier transistors AMI or a plurality of select transistors SMI may be arranged in matrix, alternatively.

The transfer transistor TMI has a transfer gate Tx, a photodiode PD, and a capacity region FD. The transfer gate Tx is a region functioning as a gate electrode of the transfer transistor TMI. The photodiode PD is a photoelectric conversion element for converting an incident light to electric signals, that is, electric charges such as electrons through photoelectric conversion. The photodiode PD is partially a region for supplying charges when it receives light so that when the entirety of the transfer transistor TMI is regarded as a MOS (metal oxide semiconductor) transistor, the photodiode PD corresponds to the source region of the transistor. The capacity region FD corresponds to the drain region of a typical MOS transistor because it converts charges supplied by the photodiode PD into electric signals (voltage) and transfers them to another transistor (for example an amplifier transistor AMI as will be described later). The transfer transistor TMI, as a whole, is therefore regarded as a transistor having a configuration similar to that of a MOS transistor.

The amplifier transistor AMI is a MOS transistor for amplifying signal charges obtained by photoelectric conversion at the photodiode PD. The transfer transistor TMI is a MOS transistor for transferring signal charges accumulated after conversion at the photodiode PD to the amplifier transistor AMI. The select transistor SMI is a MOS transistor for selecting any one of row select lines to which pixels arranged in matrix are coupled and select a pixel to be coupled to this row select line.

A trench isolation TI as an isolation region is formed so as to surround each of the transistors TMI, AMI, SMI (including an active region ACR in which the amplifier transistor AMI and the select transistor SMI are to be formed).

Figure 4:
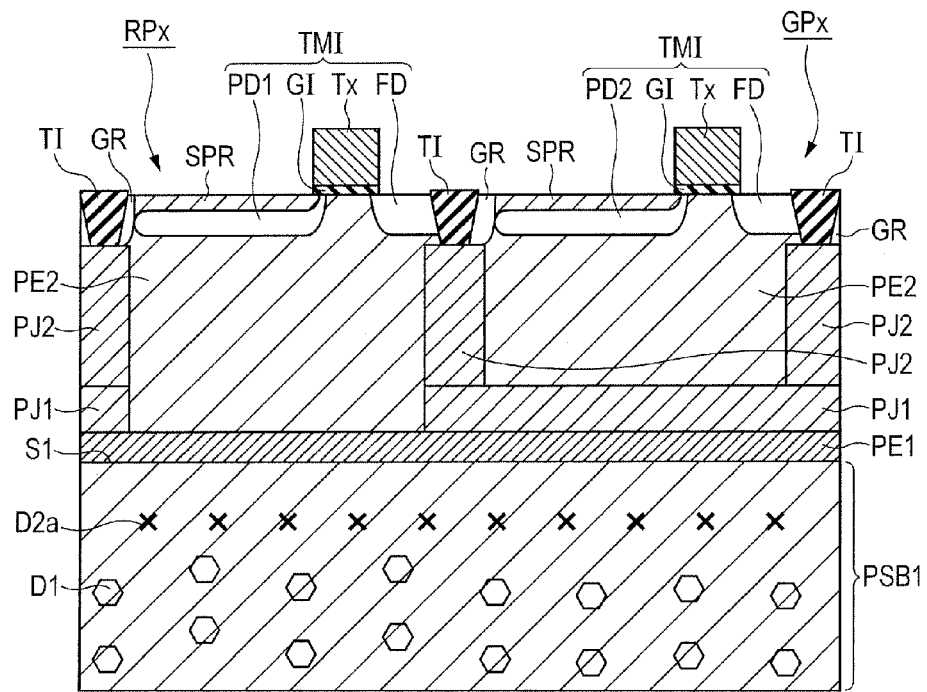
FIG. 4 is a schematic cross-sectional view showing the configuration of a pixel portion of First Embodiment.

Referring to FIG. 4, the configuration of a photodiode PD making up a semiconductor imaging device as a semiconductor device of the present embodiment and a transfer transistor TMI including the photodiode PD will next be described in detail.

FIG. 4 is a schematic cross-sectional view of a portion taken along the line IV-IV of FIG. 3. As FIG. 4 shows, the transfer transistor TMI including the photodiode PD shown in FIG. 3 is formed over a main surface S1 of a p type substrate PSB1 corresponding to the semiconductor substrate SUB of FIG. 1. The p type substrate PSB1 is a p type substrate made of, for example, silicon.

The p type substrate PSB1 has, over the main surface S1 thereof, a first p type epitaxial layer PE1 formed through so-called epitaxial growth. The first p type epitaxial layer PE1 has an upper surface covered with a second epitaxial layer PE2 formed through so-called epitaxial growth. In FIG. 4, particularly on the left side, the second epitaxial layer PE2 is formed so as to cover the upper surface of the first p type epitaxial layer PE1. The first epitaxial layer PE1 and the second epitaxial layer PE2 are each made of silicon. The first p type epitaxial layer PE1 has a p type impurity concentration higher than that of the second p type epitaxial layer PE2. Particularly in the present embodiment, the first p type epitaxial layer PE1 may have a p type impurity concentration higher than that of the p type substrate PSB1. The second epitaxial layer PE2 has a thickness greater than that of the first epitaxial layer PE1.

The second epitaxial layer PE2 has two pixel regions, that is, a first pixel region RPx and a second pixel region GPx arranged in a direction along the main surface S1 of the p type substrate PSB1. The first pixel region RPx and the second pixel region GPx are surrounded with a trench isolation TI particularly in a shallow region relatively close to the surface of the second p type epitaxial layer PE2. This means that the first pixel region RPx and the second pixel region GPx are electrically isolated from each other by the trench isolation TI sandwiched therebetween.

The first pixel region RPx and the second pixel region GPx have the transfer transistors TMI, respectively, at the surface of the second p type epitaxial layer PE2 (upper side of FIG. 4). The transfer transistor TMI of the first pixel region RPx mainly has a photodiode PD1 (first photoelectric conversion element), a capacity region FD, a gate insulating film GI, and a transfer gate Tx.

The photodiode PD1 is present rightly below a surface p type region SPR formed in the surface of the second p type epitaxial layer PE2. In other words, the photodiode PD1 is buried in the second p type epitaxial layer PE2. The capacity region FD is arranged in the surface of the second epitaxial layer PE2 with a distance from the photodiode PD1. The transfer gate Tx lies on the surface of the second epitaxial layer PE2 via the gate insulating film GI in a region sandwiched between the photodiode PD1 and the capacity region FD.

The surface p-type region SPR is a region formed right above the photodiode PD1 and having a p type impurity concentration higher than that of the second p type epitaxial layer PE2. The guard ring GR is a region formed on the surface of the second p type epitaxial layer PE2 and at the same time, on the side portion of the photodiode PD1 (trench isolation TI) and having a p type impurity concentration higher than that of the second p type epitaxial layer PE2. These regions SPR and GR are each formed to suppress spreading of a depletion layer and recombination (disappearance) of photoelectrons in the vicinity of the photodiode PD1.

The transfer transistor TMI of the second pixel region GPx has a configuration essentially similar to that of the transfer transistor TMI of the first pixel region RPx except that a photodiode PD2 (second photoelectric conversion element) is formed instead of the photodiode PD1 configuring the transfer transistor TMI. Similar to the photodiode PD1, the photodiode PD2 is therefore buried in the second p type epitaxial layer PE2.

The photodiodes PD1 and PD2, and the capacity region FD are each formed as an n type impurity region in the second p type epitaxial layer PE2 and they function as a source region and a drain region of an n type MOS transistor, respectively. The photodiode PD1 is a device having a function of photoelectrically converting an incident light hereon. The conversion of the incident light into electrons (photoelectric conversion) itself does not necessarily occur in the photodiode PD1 which is an n type impurity region and as will be described later, it may occur in the other region such as p type epitaxial layer PE2 or p type substrate PSB1. The n type impurity region has however a role of collecting electrons converted from the light so that the terms "photodiode PD1" and "photodiode PD2" as used herein are defined to mean a region collecting electrons formed by photoelectric conversion.

In FIG. 3, both the photodiode PD1 and the photodiode PD2 of FIG. 4 are called "photodiode PD". The photodiode PD1 and the photodiode PD2 are different from each other in average wavelength of a light incident thereon.

More specifically, the photodiode PD1 is equipped with an unillustrated red color filter so that it receives a light irradiated to the photodiode PD1 as a red light through the red color filter. Similarly, the photodiode PD2 is equipped with, for example, an unillustrated green color filter so that it receives a light irradiated to the photodiode PD2 as a green light through the green color filter. The photodiode PD2 may be equipped with a blue color filter instead of the green color filter.

Thus, the light which the photodiode PD1 can receive is a red light and it has a relatively long average wavelength (longest among visible lights). The photodiode PD2, on the other hand, receives a light (a green or blue light) having an average wavelength shorter than that of the light which the photodiode PD1 can receive. Since the first pixel region RPx and the second pixel region GPx are arranged in a direction along the main surface S1 of the p type substrate PSB1, the photodiode PD1 and the photodiode PD2 are arranged in a direction along the main surface SB1 of the p type substrate PSB1.

In the second pixel region GPx, the photodiode PD2 has, therebelow and in the second epitaxial layer PE2, a first implantation region PJ1 (first p type impurity region). The first implantation region PJ1 is formed so as to cover the upper surface (so as to be brought into contact with the upper surface of the first p type epitaxial layer PE1) through so-called ion implantation technology and it has a p type impurity concentration higher than that of the second p type epitaxial layer PE2.

On the other hand, as described above, the first pixel region RPx including the photodiode PD1 and the second pixel region GPx including the photodiode PD2 have, at a boundary portion therebetween, the trench isolation TI for electrically isolating these regions from each other. The trench isolation TI in the second p type epitaxial layer PE2 has, right below the trench isolation, a second implantation region PJ2 (second p type impurity region). The second implantation region PJ2 is formed through so-called ion implantation technology. The second implantation region PJ2 has a p type impurity concentration higher than that of the second p type epitaxial layer PE2.

The first implantation region PJ1 formed in the second pixel region GPx preferably extends to the boundary portion between the first pixel region RPx and the second pixel region GPx with respect to the horizontal direction of the drawing. In this case, the second implantation region PJ2 is formed so as to reach the upper surface of the first implantation region PJ1 at the boundary portion (so as to bring the second implantation region into contact with the first implantation region PJ1 on the upper surface of the first implantation region PJ1). Moreover, the second implantation region PJ2 is formed preferably to be brought into contact with the trench isolation TI right thereabove at the uppermost portion. In other words, the second implantation region PJ2 is preferably formed at the boundary portion between the first pixel region RPx and the second pixel region GPx so as to couple the first implantation region PJ1 and the trench isolation TI to each other while being sandwiched therebetween.

It is however preferred that the first implantation region PJ1 is formed only in the second pixel region GPx and at the boundary portion between the first pixel region RPx and the second pixel region GPx and is not formed in the first pixel region RPx. Since the first implantation region PJ1 is formed on the lowermost side (on the side of the p type substrate PSB1) in the second p type epitaxial layer PE2 in the second pixel region GPx, the thickness of the second p type epitaxial layer PE2 in the second pixel region GPx is apparently smaller than that of the second p type epitaxial layer PE2 in the first pixel region RPx.

By setting the p type impurity concentration of the second p type epitaxial layer PE2 smaller than that of the first p type epitaxial layer PE1 and the first and second implantation regions PJ1 and PJ2, the density of defects remaining inside is controlled to be as low as possible. On the other hand, the defect density in the p type substrate PSB1 is controlled so as to be as high as possible. The density of defects remaining in the p type substrate PSB1 is therefore higher than that of the second p type epitaxial layer PE2.

The p type substrate PSB1 has a mixture of (a plurality of) minute defects D1 and extended defects D2a. The term "defect density" means a density of both the minute defects D1 and extended defects D2a or a density of only extended defects D2a.

The defect density in the p type substrate PSB1 is controlled so as to make the life time of electrons, which are minor carriers, in the p type substrate PSB1 sufficiently shorter than the carrier life time of electrons in the p type epitaxial layer PE2, for example, 10 ns or more but not more than 500 ns.

The minute defects D1 are formed by causing the growth of minute oxygen precipitation nuclei called "BMD" (bulk micro defect) in the p type substrate PSB1 by thermal treatment. The extended defects D2a are formed by heat treatment of the p type substrate PSB1 while introducing an impurity element such as argon or silicon into the p type substrate PSB1 by ion implantation technology. They are defects (second extended defects) due to the impurity element thus introduced.

Referring to FIGS. 5 to 10, a method of manufacturing the photodiode PD making up a semiconductor imaging device as the semiconductor device of the present embodiment and the transfer transistor TMI including the photodiode PD will next be described. In FIGS. 5 to 10, a process of a region similar to that of FIG. 4 is shown.

Figure 5:
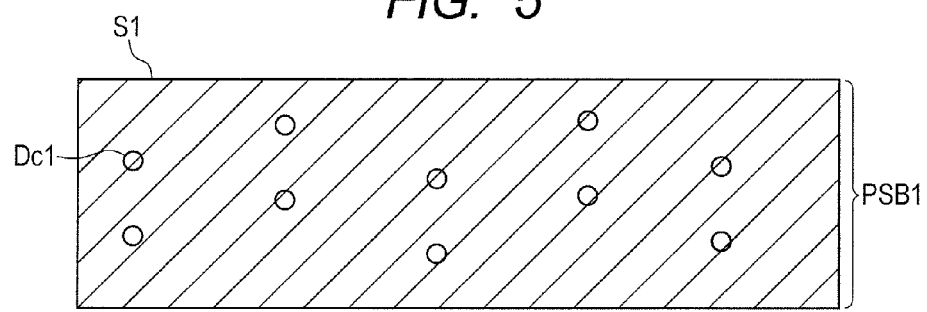
FIG. 5 is a schematic cross-sectional view showing a first step of a method of manufacturing a semiconductor device according to First Embodiment.

As shown in FIG. 5, first, a p type substrate PSB1 which is a p type substrate made of, for example, silicon and has a main surface S1 is provided. The p type substrate PSB1 has a p type impurity concentration, for example a boron concentration, of preferably 5E14 $cm^{-3}$ or more but not more than 1E16 $cm^{-3}$. The p type substrate PSB1 is formed so as to have a p type impurity concentration equivalent to that in a second p type epitaxial layer PE2 which will be described later. By heat treating the p type substrate PSB1 by using a generally known method, oxygen in the p type substrate PSB1 is formed as minute defect nuclei Dc1 which are nuclei for forming, for example, BMD. A plurality of minute defect nuclei Dc1 thus formed are scattered in the p type substrate PSB1.

Figure 6:
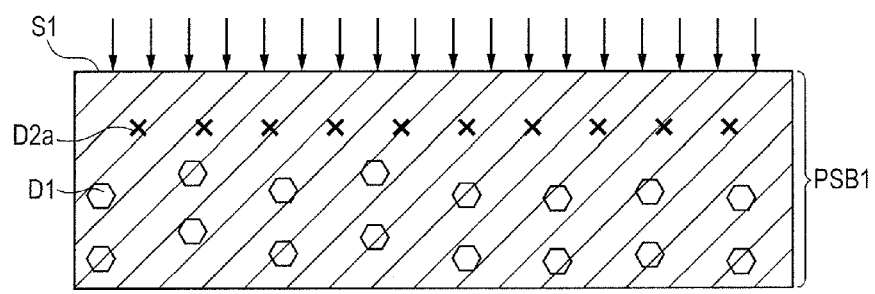
FIG. 6 is a schematic cross-sectional view showing a second step of the method of manufacturing a semiconductor device according to First Embodiment.

As shown in FIG. 6, an impurity element, for example, silicon or argon is introduced into the p type substrate PSB1 from above the main surface S1 of the p type substrate PSB1 by using ordinary ion implantation technology. Then, the p type substrate PSB1 is heat treated again by a generally known method, by which the introduced impurity element such as silicon or argon is embedded in the substrate as extended defects D2a such as dislocation loops. The minute defect nuclei Dc1 grow into minute defects D1 by this heat treatment.

The dose of the impurity element to be introduced using the ion implantation technology is preferably an amount enough for forming extended defects, for example, 5E14 $cm^{-2}$ or more.

Figure 7:
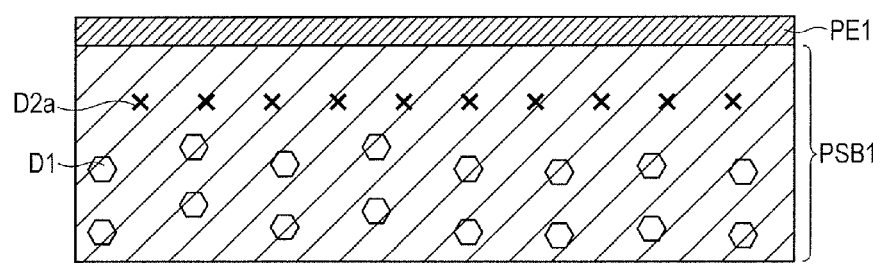
FIG. 7 is a schematic cross-sectional view showing a third step of the method of manufacturing a semiconductor device according to First Embodiment.

As shown in FIG. 7, a first p type epitaxial layer PE1 made of silicon is formed on the main surface S1 (so as to be brought into contact with the upper surface of the main surface S1) of the p type substrate PSB1 by typical epitaxial growth. The first p type epitaxial layer PE1 contains, for example, boron as a p type impurity. The concentration of boron is set at preferably, for example, 4E17 $cm^{-3}$ or more but not more than 1E20 $cm^{-3}$. The thickness of the first p type epitaxial layer PE1 is set at preferably 0.5 μm or more but not more than 3 μm, more preferably 1 μm or more but not more than 2 μm.

Figure 8:
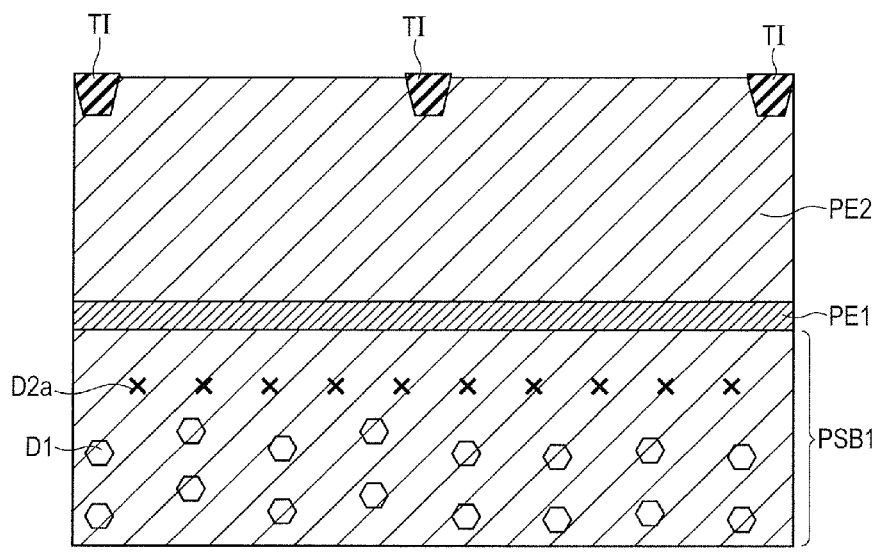
FIG. 8 is a schematic cross-sectional view showing a fourth step of the method of manufacturing a semiconductor device according to First Embodiment.

As shown in FIG. 8, a second p type epitaxial layer PE2 made of silicon is formed so as to cover therewith the upper surface of the first p type epitaxial layer PE1. The second p type epitaxial layer PE2 also contains a p type impurity, for example, boron. The concentration of boron is set at preferably, for example, 5E14 $cm^{-3}$ or more but not more than 1E16 $cm^{-3}$. It is preferably set at equivalent to the concentration of boron contained in the p type substrate PSB1. Although the thickness of the second p type epitaxial layer PE2 determines the collection sensitivity of hole electrons from a red light collected by the photodiode PD1 and varies according to the design concept of the semiconductor imaging device, it is essentially set at preferably 2 μm or more but not more than 6 μm, more preferably 3 μm or more but not more than 5 μm in the case of a visible light image sensor through which an IR (infrared) cut filter is inserted.

Formation of the minute defects D1 and implantation induced defects D2a as described above makes the defect density of the p type substrate PSB1 higher than that of the second p type epitaxial layer PE2.

Next, a shallow recess is formed in the upper surface of the second p type epitaxial layer PE2. The term "shallow recess" as used herein means a recess which is shallow enough not to reach the first p type epitaxial layer PE1 below the second p type epitaxial layer PE2. It is preferred to form a trench having a depth of, for example, 150 nm or more but not more than 400 nm. The recess is formed in regions, in a plan view, surrounding therewith the first pixel region RPx and the second pixel region GPx (regions in which a trench isolation TI is to be formed), respectively.

Then, the recess is filled with an insulating film, for example, a silicon oxide film by using, for example, typical CVD (chemical vapor deposition). The insulating film on the second p type epitaxial layer PE2 is removed using CMP (chemical mechanical polishing). In such a manner, a trench isolation TI is formed.

Figure 9:
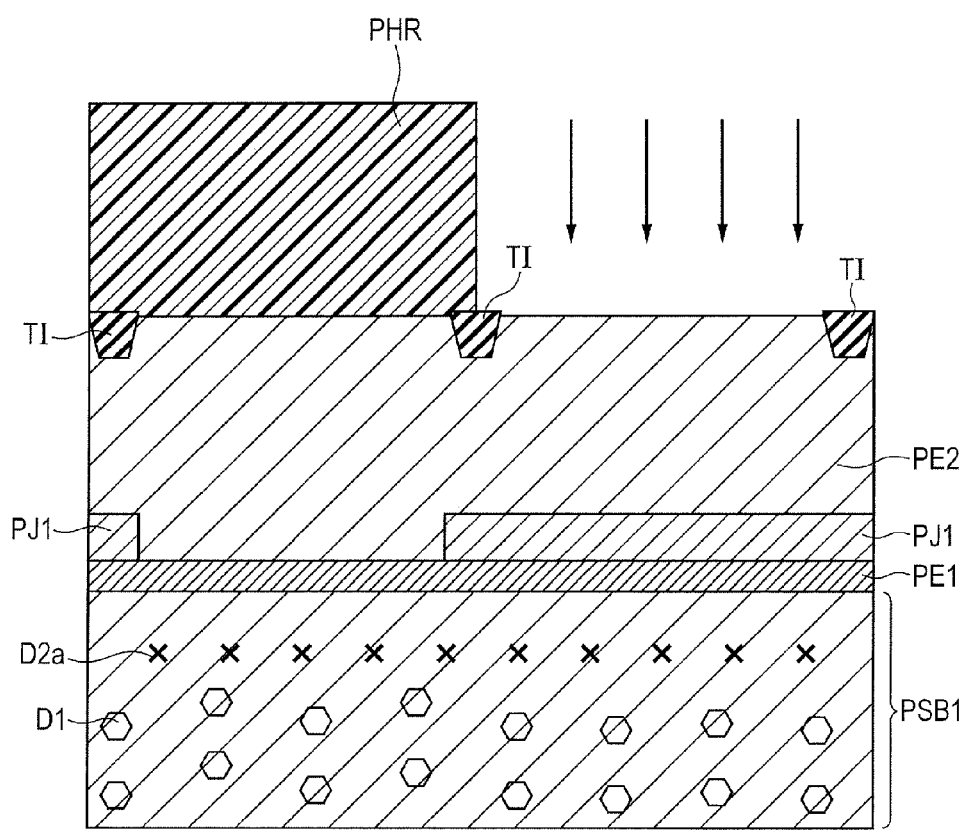
FIG. 9 is a schematic cross-sectional view showing a fifth step of the method of manufacturing a semiconductor device according to First Embodiment.

As shown in FIG. 9, a mask pattern of a photoresist PHR (photoreceptor) is formed only in the first pixel region RPx surrounded with the trench isolation TI by using typical photolithography. This mask pattern may be formed so as to include a portion of the boundary portion between the first pixel region RPx and the second pixel region GPx.

Next, by using the mask pattern of a photoresist PHR, a first implantation region PJ1 is formed through typical ion implantation technology so as to cover therewith the upper surface of the first p type epitaxial layer PE1 in the second p type epitaxial layer PE2 and below a region where the photodiode PD2 is to be formed in the second pixel region GPx. In other words, the first implantation region PJ1 is formed in the lowermost portion (on the side of the p type substrate PSB1) of the second p type epitaxial layer PE2 so as to have a p type impurity concentration higher than that of the second p type epitaxial layer PE2. As one example, when the second p type epitaxial layer PE2 has a thickness of 4 μm, a boron impurity is implanted at an energy of 2.3 MeV and a dose of 2E13 $cm^{-2}$.

Figure 10:
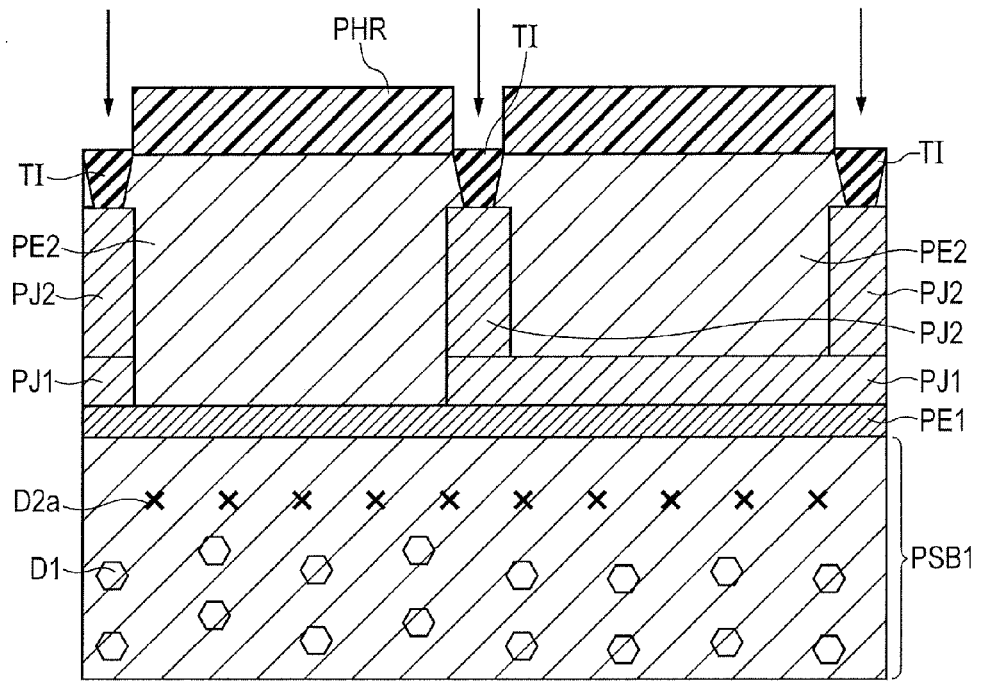
FIG. 10 is a schematic cross-sectional view showing a sixth step of the method of manufacturing a semiconductor device according to First Embodiment.

As shown in FIG. 10, a mask pattern of a photoresist PHR (photoreceiver) is formed using typical photolithography only in the first pixel region RPx and the second pixel region GPx each surrounded with the trench isolation TI. Under this state, for example, boron is next introduced into right below the trench isolation TI by typical ion implantation technology. As a result, a second implantation region PJ2 is formed in the second p type epitaxial layer PE2 at the boundary portion between the first pixel region RPx (region in which a photodiode PD1 is to be formed) and the second pixel region GPx (region in which a photodiode PD2 is to be formed).

The boron to be introduced is supplied so as to penetrate through the trench isolation TI and reach the second p type epitaxial layer PE2 right therebelow. For introducing boron, multistage implantation is preferably employed. More specifically, boron is introduced as an impurity while changing the energy in stages, for example, between 200 keV to 2.0

MeV. This makes it possible to form the second implantation region PJ2 having a p type impurity concentration higher than that of the second p type epitaxial layer PE2 and at the same time, bring the second implantation region PJ2 into contact with the first implantation region PJ1 at the lowermost portion of the second implantation region. Further, the second implantation region PJ2 can also be formed so as to be brought into contact with the trench isolation TI at the uppermost portion of the region. The implantation is followed by removal of the photoresist PHR of FIG. 10.

As shown in FIG. 4, a guard ring GR is formed through typical photolithography and ion implantation technology by implanting a p type impurity element into the bottom of the trench isolation TI and the side portion of the trench isolation TI on the respective sides where the photodiodes PD1 and PD2 are to be formed.

Next, a gate insulating film GI and a transfer gate Tx are formed at desired sites, respectively. More specifically, the gate insulating film GI is formed on the upper surface of the second p type epitaxial layer PE2 by thermal oxidation treatment. A polycrystalline silicon film or the like which will be the transfer gate Tx as a gate electrode is deposited on the gate insulating film GI. Then, the gate insulating film GI and the polycrystalline silicon or the like are patterned into the gate insulating film GI and the transfer gate Tx as shown in FIG. 4.

Next, in a region on the left side of the transfer gate Tx of FIG. 4, an n type impurity region is formed using typical photolithography and ion implantation technology. As a result, a photodiode PD1 is formed in the first pixel region RPx and a photodiode PD2 is formed in the second pixel region GPx so that they are arranged in the second p type epitaxial layer PE2 in a direction along the main surface S1 of the p type substrate PSB1. Both the first and second pixel regions RPx and GPx therefore have a capacity region FD in a region on the right side of the transfer gate Tx of FIG. 4. The photodiodes PD1 and PD2 are formed at a position adjacent to the guard ring GR.

The first pixel region RPx is equipped with a red color filter and the second pixel region GPx is equipped with a green or blue color filter, though the filters are not illustrated. The photodiode PD2 receives a light having an average wavelength shorter than that of the photodiode PD1.

The photodiodes PD1 and PD2 have, right thereabove, an n type impurity region by using typical photolithography and ion implantation technology and therefore have a surface p type region SPR.

Finally, heat treatment is performed using a generally known method to form the structure as shown in FIG. 4. Next, the effect and advantage of the present embodiment will be described referring to Comparative Examples of FIG. 11 and graphs of FIGS. 12 to 15.

Figure 11:
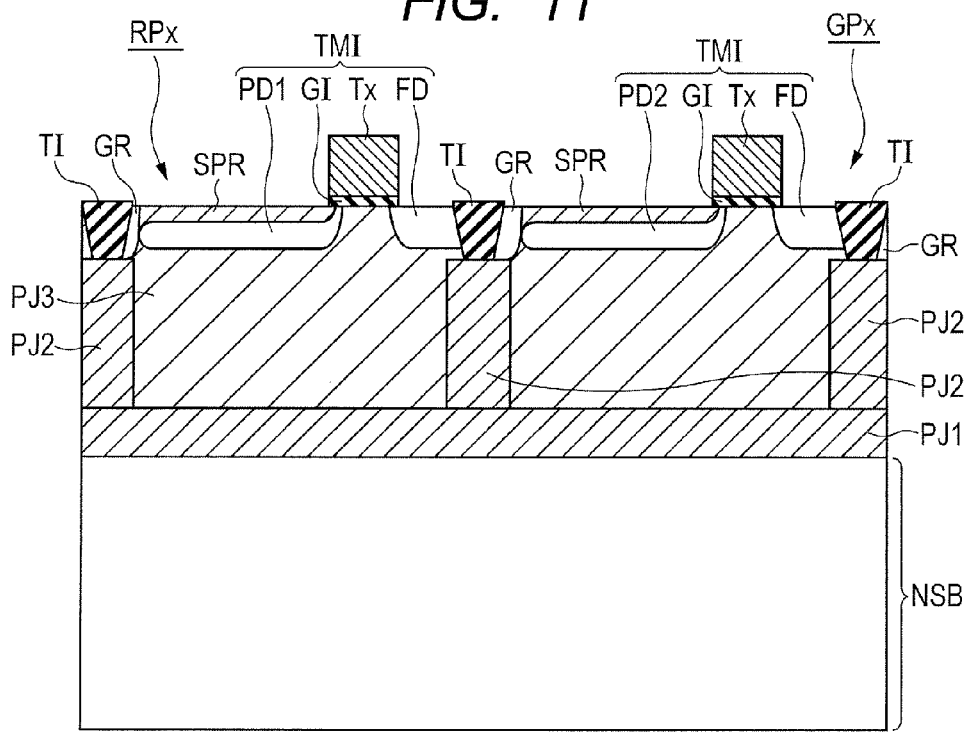
FIG. 11 is a schematic cross-sectional view showing the configuration of a pixel portion in Comparative Example of First Embodiment.

As shown in FIG. 11, the configurations of a photodiode PD making up a semiconductor imaging device as a semiconductor device of Comparative Example and a transfer transistor TMI including the photodiode PD are different in the following points. Described specifically, in FIG. 11, an n type substrate NSB is used instead of the p type substrate PSB1 (using the p type substrate PSB1 is however permitted). Instead of the first p type epitaxial layer PE1 of FIG. 4, a first implantation region PJ1 is formed using ion implantation technology. The first implantation region PJ1 has thereon, instead of the second p type epitaxial layer PE2 of FIG. 4, a third implantation region PJ3 formed by ion implantation technology and the third implantation region PJ3 has therein photodiodes PD1 and PD2, and the like. A second implantation region PJ2 is formed using ion implantation technology at the boundary portion between the first pixel region RPx and the second pixel region GPx so as to reach the first implantation region PJ1.

In the present embodiment, the p type epitaxial layers PE1 and PE2 are formed using epitaxial growth. In Comparative Example, on the other hand, implantation regions PJ1 and PJ3 corresponding thereto, respectively, are formed using ion implantation technology but they are made of silicon similar to the present embodiment.

Figure 12:
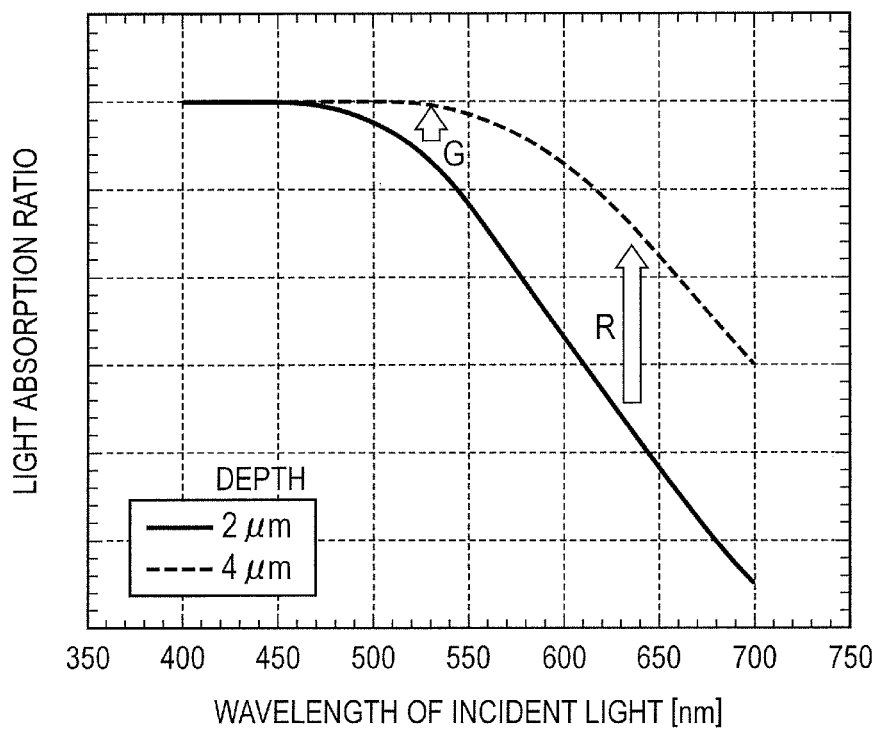
FIG. 12 is a graph showing, by the wavelength of light, the relation between a depth at which photoelectron conversion occurs and collection efficiency of electrons.

As FIG. 12 shows, the wavelength (nm) of a light incident on a photodiode is plotted along the abscissa, while an absorption ratio of electrons generated by the photoelectric conversion of the light, which the photodiode has received, in a semiconductor imaging device is plotted as a light absorption ratio (arbitrary unit on the ordinate) on the ordinate. It is to be noted that the photodiode is formed inside silicon.

From FIG. 12, it is apparent that electrons generated by the photoelectric conversion of a (R (red)) light having a particularly long wavelength are collected by a photodiode at a markedly high ratio when a collection region extends to a deep position (4 µm) from the surface where the photodiode is formed compared with a collection region extending to a shallow position (2 µm) from the surface. When electrons generated by the photoelectric conversion of a (G (green)) light having a short wavelength are collected, on the other hand, there is no large difference between a collection region extending only to a shallow position from the surface and a collection region extending to a deep position from the surface. In either case, electrons are collected by the photodiode at a relatively high ratio compared with electrons generated from a light having a long wavelength.

In short, a photodiode receiving a light having a particularly long wavelength, that is, a red light is desired to easily collect electrons generated by the photoelectric conversion at a position deep from the surface of the semiconductor imaging device. In other words, a photodiode for a red light is desired to have a high sensitivity to electrons generated by the photoelectric conversion at a deep position from the surface of the semiconductor imaging device.

A long-wavelength light is likely to penetrate into a deeper position in the semiconductor imaging device, compared with a short-wavelength light. The configuration permitting collection of electrons generated at a deep position by the photoelectric conversion can enhance the sensitivity of a photodiode for a long wavelength light.

When the p type region PJ3 in which the photodiode PD1 receiving a long-wavelength light is formed as shown in FIG. 11 is formed using ion implantation technology, the p type region PJ3 cannot have a great depth (as in the first implantation region PJ1 of FIG. 11, a thin film can be sometimes formed in a deep region by ion implantation technology, which however depends on the thickness or width of a region thus formed), because ion implantation technology is not suited for the formation of an impurity region extending from the surface to a relatively deep region.

As FIG. 4 shows, therefore, the p type region PE2 is formed instead of the p type region PJ3 by epitaxial growth. Since the thickness of the second p type epitaxial layer PE2 formed by epitaxial growth can be controlled freely compared with the p type region PJ3 formed by ion implantation technology, a p type impurity region extending from the surface to a relatively deep region can therefore be formed. This means that the second p type epitaxial layer PE2 of FIG. 4 extends to a deeper position than the third implantation region PJ3 of FIG. 11. Electrons generated by the photoelectric conversion which has occurred in a particularly deep region in the p type impurity region PE2 can therefore be collected at a high sensitivity by the photodiode PD1. As a result, the photodiode PD1 can have an enhanced sensitivity to electrons.

In addition, since the p type epitaxial layer PE2 is formed using epitaxial growth, the remaining defect density contained in the p type epitaxial layer PE2 can be made smaller than that contained in a region corresponding thereto formed by ion implantation technology. This enables the photodiode PD1 to collect electrons generated in the p type epitaxial layer PE2 at a higher ratio.

Figure 13:
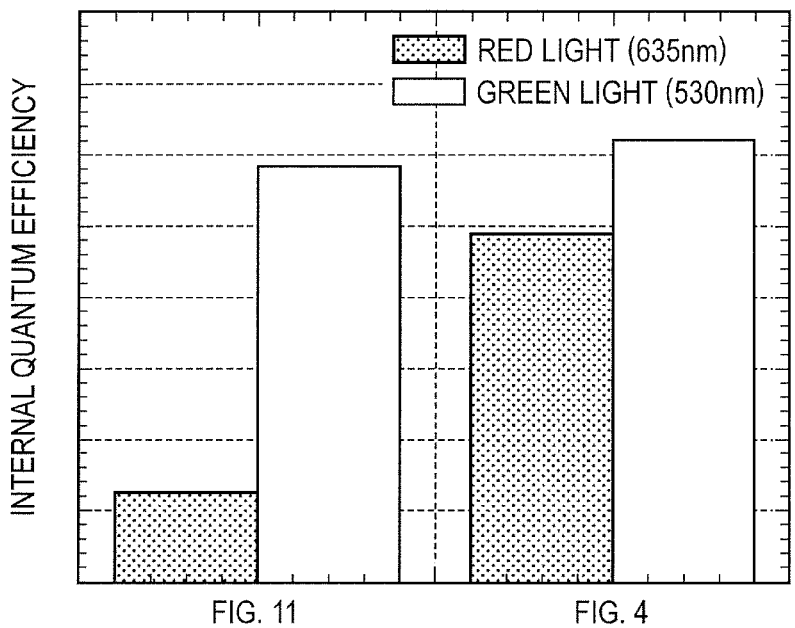
FIG. 13 is a graph showing the collection efficiency of electrons from a red light and a green light in First Embodiment and Comparative Examples.

In FIG. 13, this bar graph shows the internal quantum efficiency (arbitrary unit on ordinate) of each of electrons generated by the photoelectric conversion of a red light (having a wavelength of 635 nm) and electrons generated by the photoelectric conversion of a green light (having a wavelength of 530 nm) in the semiconductor imaging device of Comparative Example shown in FIG. 11 and that of the present embodiment shown in FIG. 4. The term "internal quantum efficiency" as used herein means a collection ratio, by a photodiode, of electrons obtained by conversion.

It is apparent from FIG. 13 that particularly, the collection efficiency of electrons generated by the photoelectric conversion of a red light is enhanced greatly by forming, as in the present embodiment, the second p type epitaxial layer PE2 having a depth greater than that of the third implantation region PJ3 of Comparative Example. The collection efficiency of electrons generated by the photoelectric conversion of a green light is also enhanced a little.

Figure 14:
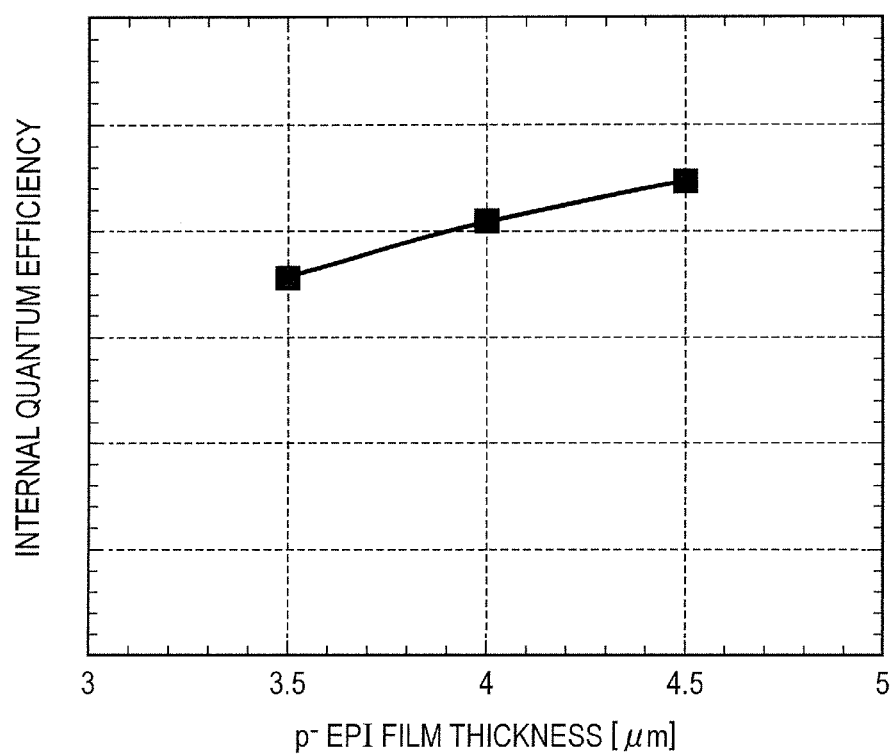
FIG. 14 is a graph showing the relation between the film thickness of a second p type epitaxial layer and an internal quantum efficiency.

This is also apparent from FIG. 14. As shown in the graph of FIG. 14, a thickness (μm) of the second p type epitaxial layer PE2 is plotted along the abscissa and an internal quantum efficiency (arbitrary unit on ordinate) of electrons generated by the photoelectric conversion of, for example, a red light is plotted along the ordinate. FIG. 14 suggests that with an increase in the thickness (μm) of the second p type epitaxial layer PE2, the collection efficiency of electrons increases.

A long-wavelength red light is likely to penetrate deeper in the thin film and in the substrate so that photoelectric conversion may occur in the semiconductor substrate SUB below the second p type epitaxial layer PE2. When this semiconductor substrate SUB is an n type substrate NSB, for example, as in Comparative Example of FIG. 11, electrons generated by the photoelectric conversion of a long-wavelength light in the n type substrate NSB are collected at a high ratio in the n type substrate NSB, because the n type substrate has a property of easily collecting electrons compared with the p type substrate. This leads to a reduction in the ratio of electrons collected by the photodiode PD1, causing deterioration in the sensitivity of the photodiode PD1 to electrons.

Using the p type substrate PSB1, for example, as in the present embodiment of FIG. 4 therefore can suppress collection of electrons by such a substrate and enhance the sensitivity to electrons generated by the photoelectric conversion which has occurred in the substrate.

The p type substrate PSB1 is formed right below the first pixel region RPx and the second pixel region GPx so that for example, electrons generated from the light, which the photodiode PD1 has received, in the p type substrate PSB1 right below the first pixel region RPx easily proceed to the second pixel region GPx adjacent thereto. Then electrons generated from the light incident on the photodiode PD1 may be collected by the photodiode PD2. Such a phenomenon is called "electronic crosstalk" and it may cause deterioration in electron detection sensitivity of the photodiodes PD1 and PD2 and color mixing. This means that only replacement of the n type substrate NSB with the p type substrate PSB1 increases an electronic crosstalk in the p type substrate PSB1, which may lead to deterioration in the electron detection sensitivity of the photodiodes PD1 and PD2 and color mixing.

Also when light signals of a level exceeding a saturated signal level are input, there is a possibility of blooming, that is, malfunction causing collection of photoelectrons not by a photodiode which is supposed to collect them but by another photodiode adjacent thereto.

Thickening the second p type epitaxial layer PE2 to enhance the internal quantum efficiency of the photodiode PD1 increases the possibility of electronic crosstalk.

In FIG. 15, the abscissa of this graph, similar to the abscissa of the graph of FIG. 14, shows a film thickness. In each of the line graphs shown with a solid line in FIG. 15, an internal quantum efficiency (arbitrary unit on ordinate) of electrons generated from, for example, a red light is plotted along the ordinate. In the line graphs shown with a dotted line in FIG. 15, an electronic crosstalk, that is, a collection ratio, in an undesired photodiode, of electrons generated by photoelectric conversion of, for example, a red light is plotted along the ordinate.

The line graph shown with a solid line and a square in FIG. 15 is the same as the line graph of FIG. 14, while the line graph shown with a dotted line and a square in FIG. 15 shows an occurrence ratio of electronic crosstalk under a condition similar to that in the line graph of FIG. 14. They are made under the condition of "without dislocation loops", meaning that implantation induced defects D2a are not formed intentionally. An increase in the thickness of the second p type epitaxial layer PE2 to enhance the internal quantum efficiency tends to increase the occurrence ratio of electronic crosstalk, which is presumed to result from an increase in the occurrence ratio of photoelectric conversion in the p type substrate PSB1 which is a deeper region.

In the present embodiment, by using the method shown in the steps of FIGS. 5 and 6, the semiconductor substrate SUB is converted into the p type substrate PSB1, that is, a p type impurity-containing substrate, and at the same time, the defect density of the p type substrate PSB1 is made higher than that of the second p type epitaxial layer PE2. More specifically, a number of implantation induced defects D2a such as dislocation loops and minute defects D1 derived from BMD of oxygen are formed in advance in the p type substrate PSB1. Then, electrons generated in the p type substrate PSB1 recombine and disappear in the p type substrate PSB1 due to these defects so that the carrier life time of the electrons decreases drastically. This makes it possible to reduce the possibility of electrons generated in the p type substrate PSB1 causing electronic crosstalk. Thus, due to intentionally formed defects D1 and D2, electrons generated in the p type substrate PSB1 can be caused to disappear efficiently by recombination.

Referring to FIG. 15 again, when implantation induced defects D2a such as dislocation loops are intentionally formed in the p type substrate PSB1 ("with dislocation loops" in the graph), an occurrence ratio of electronic crosstalk decreases compared with that when the defects are not formed. An occurrence ratio of electronic crosstalk decreases further when an oxygen concentration in the substrate is controlled and thereby the density of defect complexes D2b, which will be described later, formed in the substrate by the minute defects D1 is also controlled ("control of substrate life time" in the graph).

In short, in the present embodiment, by allowing the photodiode PD1 to collect, efficiently at a high ratio, electrons generated by the photoelectric conversion in the second p type epitaxial layer PE2 and on the contrary, allowing electrons generated by the photoelectric conversion in the p type substrate PSB1 to disappear quickly, two objects in a trade-off relationship, that is, a high internal quantum efficiency and low electronic crosstalk can be achieved.

In the present embodiment, the first p type epitaxial layer PE1 is sandwiched between the p type substrate PSB1 and the second p type epitaxial layer PE2 and the first p type epitaxial layer PE1 is used as a boundary portion between the p type substrate PSB1 and the second p type epitaxial layer PE2. In addition, the first p type epitaxial layer PE1 has a p type impurity concentration higher than that of the second p type epitaxial layer PE2. The first p type epitaxial layer PE1 therefore functions as a potential barrier for suppressing electrons generated in the p type substrate PSB1 from proceeding to the second p type epitaxial layer PE2.

This also applies to the first implantation region PJ1 and the second implantation region PJ2 having a p type impurity concentration set higher than that of the second p type epitaxial layer PE2. For example, the first implantation region PJ1 functions, in the second pixel region GPx, as a potential barrier for suppressing electrons from proceeding from the p type substrate PSB1 to the second p type epitaxial layer PE2. The second implantation region PJ2 functions as a potential barrier for suppressing electrons, which have been obtained by the photoelectric conversion, in the second p type epitaxial layer PE2 from moving between the first pixel region RPx and the second pixel region GPx.

The second implantation region PJ2 is brought into contact with the first implantation region PJ1 at the upper surface thereof so that in a region where the first implantation region PJ1 and the second implantation region PJ2 are contiguous to each other, these regions are coupled to each other and no space is formed between these regions (no implantation region is formed). The second p type epitaxial layer PE2 of each of the first pixel region RPx and the second pixel region GPx is completely surrounded, below the epitaxial layer, with the implantation regions PJ1 and PJ2 so that the implantation regions PJ1 and PJ2 suppress electronic crosstalk, making it possible to further enhance the sensitivity of the photodiode PD1 for collecting electrons obtained by the photoelectric conversion by the photodiode PD1.

Supposing that the second implantation region PJ2 is, at the upper surface thereof, brought into contact with the trench isolation TI, the second p type epitaxial layer PE2 of the first pixel region RPx and the second pixel region GPx is, at an upper portion and lower portion of the epitaxial layer, surrounded completely with the implantation regions PJ1 and PJ2. This further enhances the electronic crosstalk suppressing effect of the implantation regions PJ1 and PJ2.

Although the first implantation region PJ1 is formed to cover the upper surface of the first p type epitaxial layer PE1 in the second pixel region GPx, the first implantation region PJ1 is not formed in the first pixel region RPx. This means that in a pixel region having a photoelectric conversion element, such as the photodiode PD1, which receives a light having a relatively long wavelength, the first implantation region PJ1 covering the upper surface of the first p type epitaxial layer PE1 is not formed. An apparent thickness of the second p type epitaxial layer PE2 is therefore smaller in the second pixel region GPx than in the first pixel region RPx. The photodiode PD2 of the second pixel region GPx capable of receiving a short-wavelength light can collect, at a high ratio, even electrons obtained by the photoelectric conversion in a shallow region so that no functional problem occurs.

In the present embodiment, the first p type epitaxial layer PE1 and the second p type epitaxial layer PE2 are made of the same material, that is, silicon so that the possibility of generation of leak current at the interface between them can be reduced.

Second Embodiment

First, referring to FIG. 16, the configuration of a photodiode PD making up a semiconductor imaging device as a semiconductor device of the present embodiment and a transfer transistor TMI including the photodiode PD will be described in detail.

Figure 16:
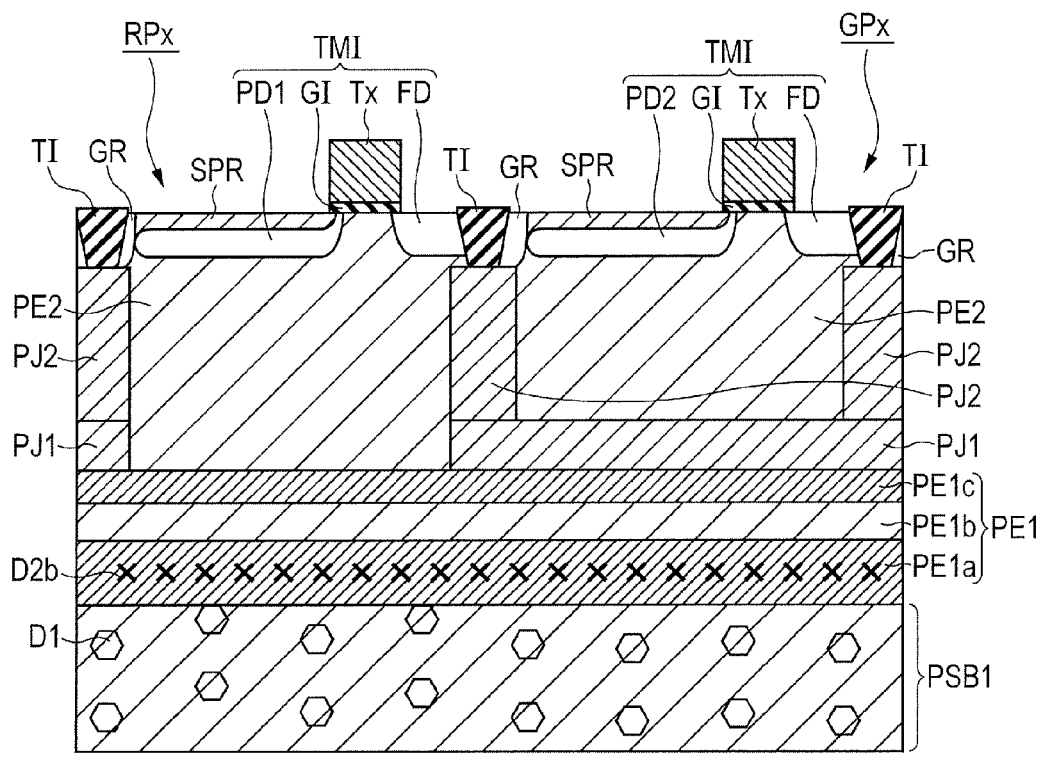
FIG. 16 is a schematic cross-sectional view showing the configuration of a pixel portion in Second Embodiment.

FIG. 16 is a schematic cross-sectional view showing a mode of a region same as that of First Embodiment shown in FIG. 4. As FIG. 16 shows, the present embodiment has essentially a configuration similar to First Embodiment shown in FIG. 4, but differs from First Embodiment in the following point.

Described specifically, in the present embodiment, the first p type epitaxial layer PE1 is comprised of a plurality of p type epitaxial layers different from each other. It has a film stack of, from the side of the p type substrate PSB1, a heavily doped p type epitaxial layer PE1$a$, a lightly doped p type epitaxial layer PE1$b$, and a heavily doped p type epitaxial layer PE1$c$ in order of mention. The p type impurity concentration in the heavily doped p type epitaxial layer PE1$a$ and the heavily doped p type epitaxial layer PE1$c$ is higher than the p type impurity concentration in the second p type epitaxial layer PE2. It is substantially equal to, for example, the p type impurity concentration in the first p type epitaxial layer PE1 of First Embodiment. The p type impurity concentration in the lightly dope p type epitaxial layer PE1$b$ is substantially equal to the p type impurity concentration in the second p type epitaxial layer PE2.

The heavily doped p type epitaxial layer PE1$a$ (substrate adjacent layer) arranged on the side closest to the p type substrate PSB1 has defect complexes D2$b$ (first extended defects). The defect complexes D2$b$ are formed as a result of a reaction, in the heavily doped p type epitaxial layer PE1$a$, between a p type impurity, for example, boron in the heavily doped p type epitaxial layer PE1$a$ and oxygen precipitation nuclei (for example those configuring the minute defects D1) diffused into the p type epitaxial layer PE1$a$ from the p type substrate PSB1 adjacent to the heavily doped p type epitaxial layer PE1$a$.

In short, the heavily doped p type epitaxial layer PE1$a$ lying as the lowermost layer is, from the standpoint of containing a p type impurity (boron) at a high concentration for forming the defect complexes D2$b$ and facilitating binding with oxygen nuclei in the p type substrate PSB1 as much as possible, formed at a position adjacent to the p type substrate PSB1.

The oxygen concentration in the heavily doped p type epitaxial layer PE1$a$ arranged on the side closest to the p type substrate PSB1 among the layers configuring the first p type epitaxial layers PE1 is higher than the oxygen concentration in the layers configuring the first p type epitaxial layer PE1 other than the heavily doped p type epitaxial layer PE1$a$.

The heavily doped p type epitaxial layer PE1$c$ which is the uppermost layer has a role similar to that of the first p type epitaxial layer PE1 in First Embodiment. Described specifically, it partitions between the p type substrate PSB1 and the second p type epitaxial layer PE2 and is arranged to suppress free transfer of electrons between them. The lightly doped p type epitaxial layer PE1b sandwiched between the p type epitaxial layer PE1a and the p type epitaxial layer PE1c has a role as a buffer layer between them.

The configuration of the present embodiment other than the above-mentioned epitaxial layer is substantially similar to that of First Embodiment shown in FIG. 4 so that like components are identified by like reference numerals and an overlapping description is omitted.

Referring to FIGS. 17 to 21, a method of manufacturing the photodiode PD making up a semiconductor imaging device as the semiconductor device of the present embodiment and the transfer transistor TMI including the photodiode PD will be described. FIGS. 17 to 21 show a process of a region same as that of FIG. 16.

Figure 17:
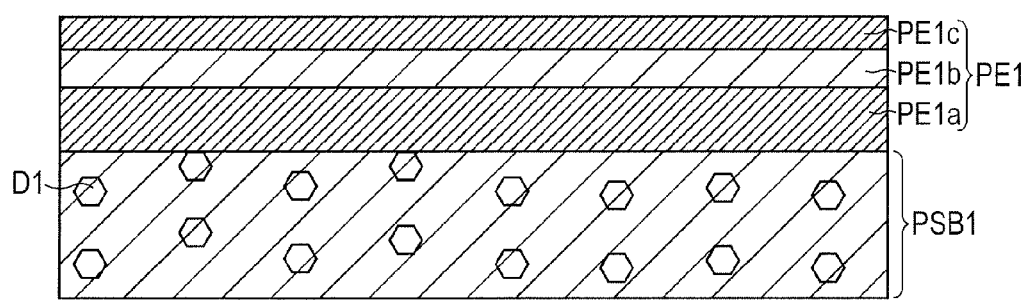
FIG. 17 is a schematic cross-sectional view showing a first step of a method of manufacturing a semiconductor device according to Second Embodiment.

As FIG. 17 shows, a first p type epitaxial layer PE1 comprised of a plurality of layers is formed by typical epitaxial growth over the main surface of a p type substrate PSB1 provided as in First Embodiment. The term "a plurality of layers" as used herein means, for example, three layers obtained by stacking, from the side close to the p type substrate PSB1, a heavily doped p type epitaxial layer PE1a, a lightly doped p type epitaxial layer PE1b, and a heavily doped p type epitaxial layer PE1c one after another in order of mention. The heavily doped p type epitaxial layers PE1a and PE1c each contain boron as a p type impurity at a concentration equivalent to that of boron in the first p type epitaxial layer PE1 of First Embodiment. More specifically, the concentration of boron set at, for example, $4E17\ cm^{-3}$ or more but not more than $1E20\ cm^{-3}$ is preferred. The lightly doped p type epitaxial layer PE1b contains boron as a p type impurity at a concentration equivalent to that of boron in the second p type epitaxial layer PE2 of First Embodiment. More specifically, the concentration of boron set at, for example, $5E14\ cm^{-3}$ or more but not more than $1E16\ cm^{-3}$ is preferred.

The oxygen concentration in the heavily doped p type epitaxial layer PE1a arranged on the side closest to the p type substrate PSB1, among the layers configuring the first p type epitaxial layer PE1, is set higher than the oxygen concentration in the layers configuring the first p type epitaxial layer PE1 other than the heavily doped p type epitaxial layer PE1a. During this procedure, minute defect nuclei Dc1 may grow into minute defects D1 by the heat treatment.

Figure 18:
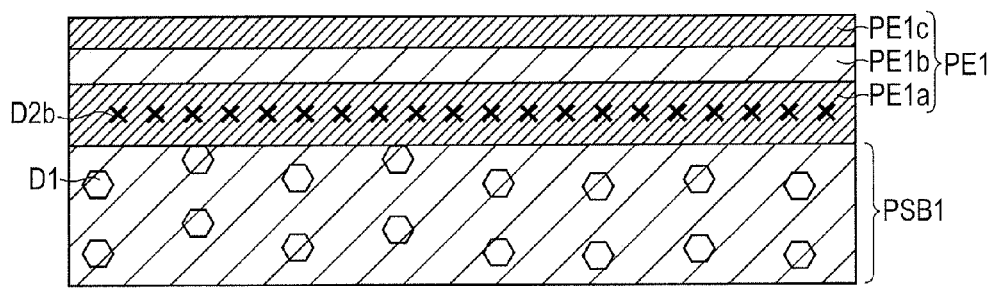
FIG. 18 is a schematic cross-sectional view showing a second step of the method of manufacturing a semiconductor device according to Second Embodiment.

Referring to FIG. 18, the structure formed in FIG. 17 is heat treated. By this heat treatment, oxygen (including minute defects D1) contained in the p type substrate PSB1 diffuse into the heavily doped p type epitaxial layer PE1a. By this diffusion, oxygen (including minute defects D1) contained in the heavily doped p type epitaxial layer PE1a reacts with boron, that is, a p type impurity introduced into the heavily doped p type epitaxial layer PE1a to form defect complexes D2b in the heavily doped p type epitaxial layer PE1a.

Figure 19:
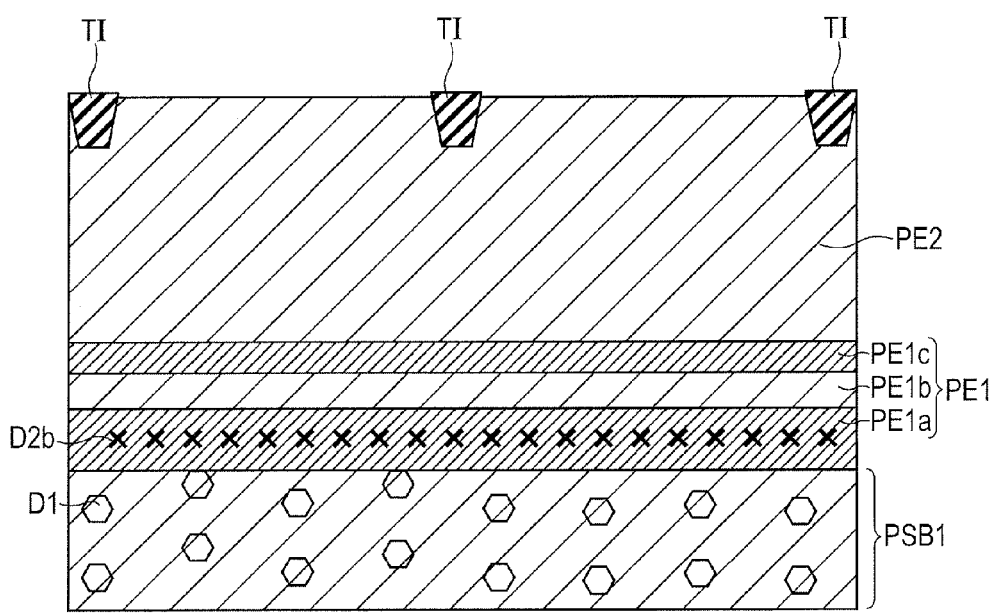
FIG. 19 is a schematic cross-sectional view showing a third step of the method of manufacturing a semiconductor device according to Second Embodiment.
Figure 20:
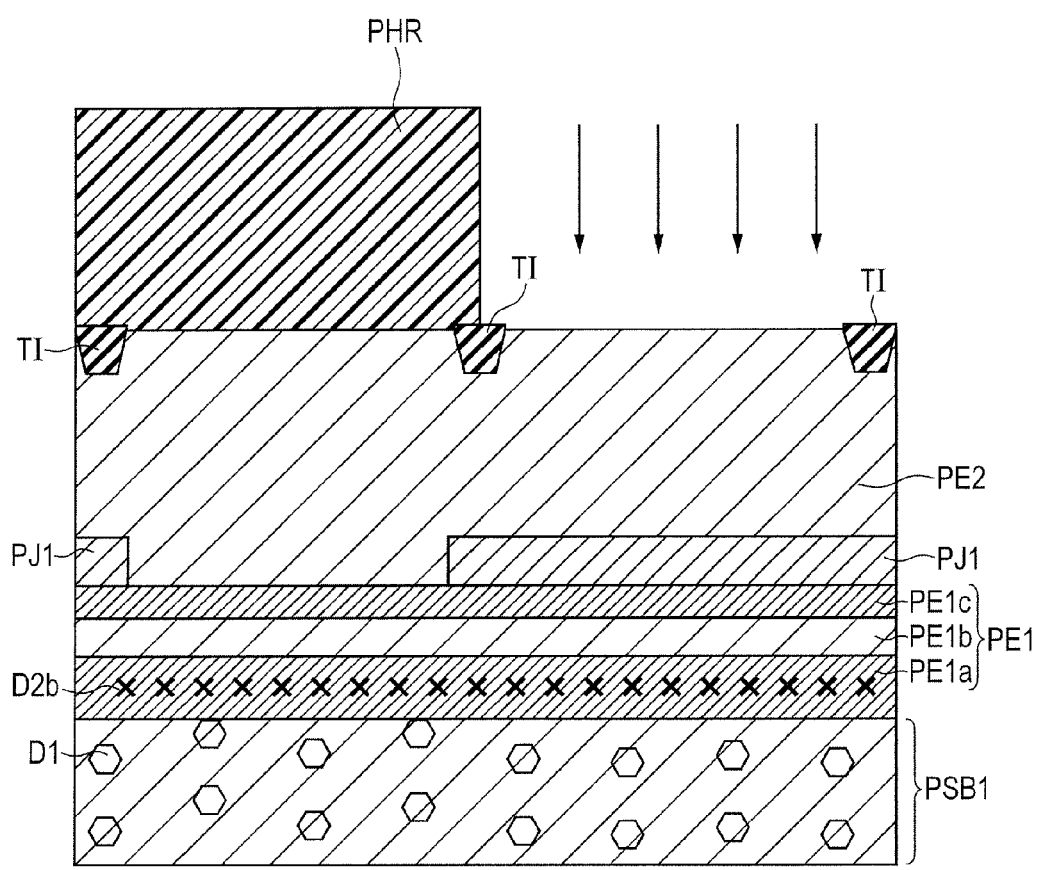
FIG. 20 is a schematic cross-sectional view showing a fourth step of the method of manufacturing a semiconductor device according to Second Embodiment.
Figure 21:
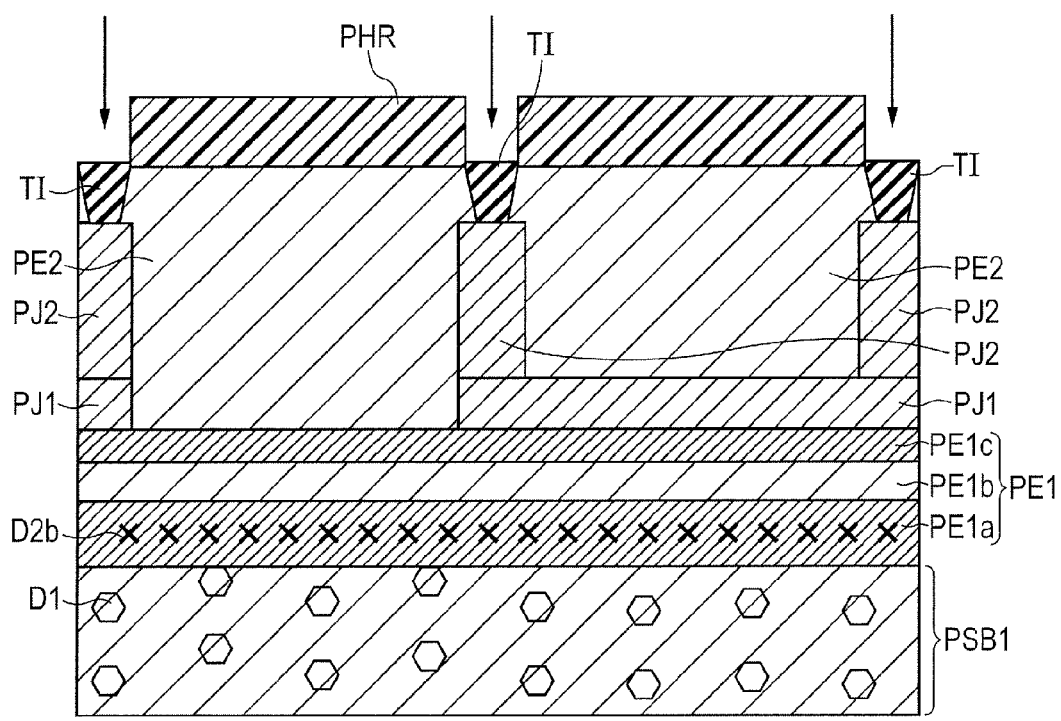
FIG. 21 is a schematic cross-sectional view showing a fifth step of the method of manufacturing a semiconductor device according to Second Embodiment.

As FIGS. 19 to 21 show, by carrying out treatments similar to those of First Embodiment shown in FIGS. 8 to 10 and then, a post-step similar to that of First Embodiment shown in FIG. 10, the structure shown in FIG. 16 is formed.

The effect and advantage of the present embodiment will next be described.

The defect complexes D2b, similar to the implantation induced defects D2a in the p type substrate PSB1 in First Embodiment, have a role as a carrier life time killer for allowing electrons generated by the photoelectric conversion in the p type substrate PSB1 to disappear promptly. Presence of the heavily doped p type epitaxial layer PE1a can therefore suppress generation of electronic crosstalk or blooming resulting from electrons in the p type substrate PSB1.

The heavily doped p type epitaxial layer PE1a also contributes as an oxygen diffusion block layer. Described specifically, the heavily doped p type epitaxial layer PE1a has a function of suppressing diffusion of oxygen in the p type substrate PSB1 and the minute defects D1 derived therefrom in a direction of, for example, the second p type epitaxial layer PE2. This makes it possible to suppress the extended defects from entering the second p type epitaxial layer PE2 and therefore suppress disappearance (reduction in lifetime of electrons) of electrons in the second p type epitaxial layer PE2 due to recombination. As a result, the photodiode PD1 has an enhanced sensitivity.

In the present embodiment, defect complexes D2b are formed only by heat treatment instead of the implantation induced defects D2a formed by ion implantation technology in First Embodiment. Omission of a step of using the ion implantation technology for forming the extended defects leads to cost reduction.

As described above, among the layers configuring the first p type epitaxial layer PE1, the heavily doped p type epitaxial layer PE1a is formed to have an oxygen concentration higher than that of the other p type epitaxial layers PE1b and PE1c, which owes to diffusion of oxygen (including minute defects D1) contained in the p type substrate PSB1 into the heavily doped p type epitaxial layer PE1a which is a substrate adjacent layer closest to the p type substrate PSB1. The oxygen concentration of the heavily doped p type epitaxial layer PE1a higher than that of the other p type epitaxial layers increases a formation efficiency of defect complexes D2 in the heavily doped p type epitaxial layer PE1a and enhances the function of the heavily doped p type epitaxial layer PE1a as a potential barrier.

Third Embodiment

Figure 22:
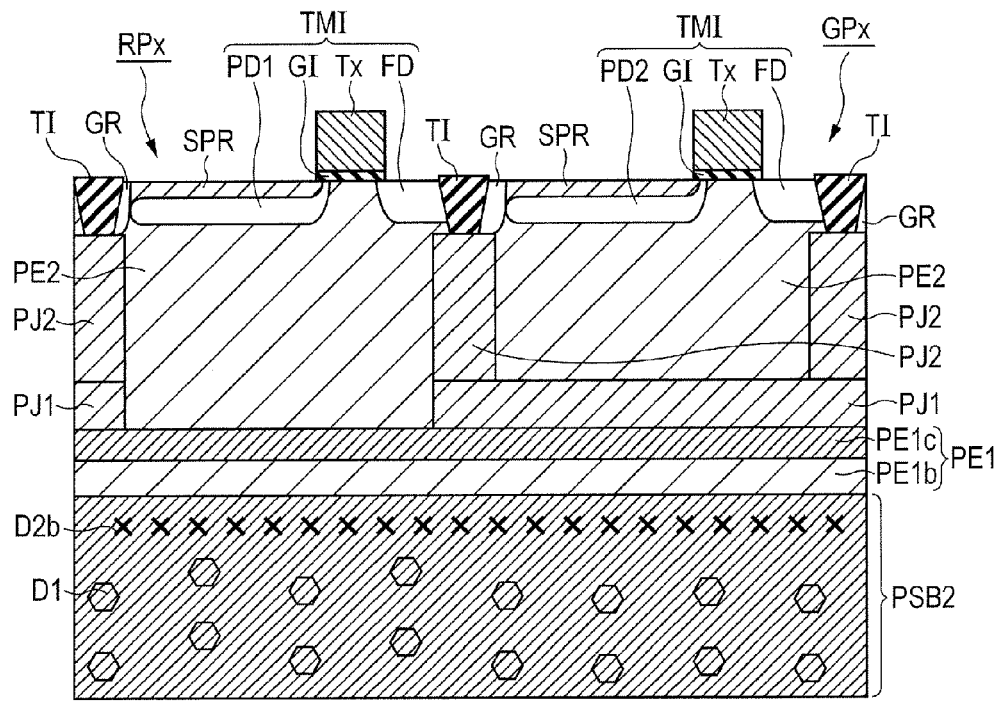
FIG. 22 is a schematic cross-sectional view showing the configuration of a pixel portion in Third Embodiment.

Referring to FIG. 22, the configuration of a photodiode PD making up a semiconductor imaging device as a semiconductor device of the present embodiment and a transfer transistor TMI including the photodiode PD will next be described in detail.

FIG. 22 is a schematic cross-sectional view showing a mode of a region same as that of First Embodiment shown in FIG. 4. As FIG. 22 shows, a p type substrate PSB2 having a p type impurity concentration higher than that of the p type substrate PSB1 in FIG. 16 is used as the semiconductor substrate SUB. More specifically, the p type impurity concentration of the p type substrate PSB2 is equivalent to the p type impurity concentration of the heavily doped p type epitaxial layer PE1c configuring the first p type epitaxial layer PE1. Further, the p type impurity concentration of the first p type epitaxial layer PE1 is equivalent to the p type impurity concentration of the p type epitaxial layer PE1 of First and Second Embodiments. In the present embodiment, the p type impurity concentration of the p type substrate PSB2 is considerably higher than the p type impurity concentration of the second p type epitaxial layer PE2.

The p type substrate PSB2 contains therein minute defects D1 and defect complexes D2b. The defect complexes D2b are formed as a result of a reaction, in the p type substrate PSB2, between a p type impurity, for example, boron in the p type substrate PSB2 and oxygen precipitation nuclei (such as those configuring the minute defects D1) diffused into the p type substrate PSB2.

The first p type epitaxial layer PE1 on the main surface of the p type substrate PSB2 includes a plurality of p type epitaxial layers different from each other and it has, from the side of the p type substrate PSB2, a lightly doped p type epitaxial layer PE1b and a heavily doped p type epitaxial layer PE1c stacked one after another in order of mention. They are similar to those of Second Embodiment.

This means that the heavily doped P type epitaxial layer PE1a of Second Embodiment in which defect complexes D2b are formed are, in the present embodiment, integrated with the p type substrate PSB2. The p type impurity concentration of the p type substrate PSB2 therefore is high because of the high p type impurity concentration of the heavily doped p type epitaxial layer PE1a.

The configuration of the present embodiment other than the above-mentioned epitaxial layer is substantially similar to that of Second Embodiment shown in FIG. 16 so that like components are identified by like reference numerals and an overlapping description is omitted.

Referring to FIGS. 23 to 26, a method of manufacturing the photodiode PD making up a semiconductor imaging device as the semiconductor device of the present embodiment and the transfer transistor TMI including the photodiode PD will be described. FIGS. 23 to 26 show a process of a region same as that of FIG. 22.

Figure 23:
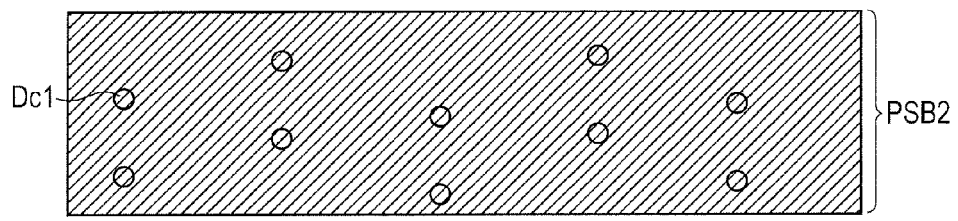
FIG. 23 is a schematic cross-sectional view showing a first step of a method of manufacturing a semiconductor device according to Third Embodiment.

As FIG. 23 shows, a p type substrate PSB2 is provided as a p type substrate made of, for example, silicon. The concentration of a p type impurity such as boron in the p type substrate PSB2 is set at 4E17 $cm^{-3}$ or more but not more than 1E20 $cm^{-3}$ which is higher than the p type impurity of, for example, the p type substrate PSB1 of First Embodiment. The p type substrate PSB2 is heat treated by a generally known method to form oxygen in the p type substrate PSB2 as minute defect nuclei Dc1 for forming, for example, BMD.

Figure 24:
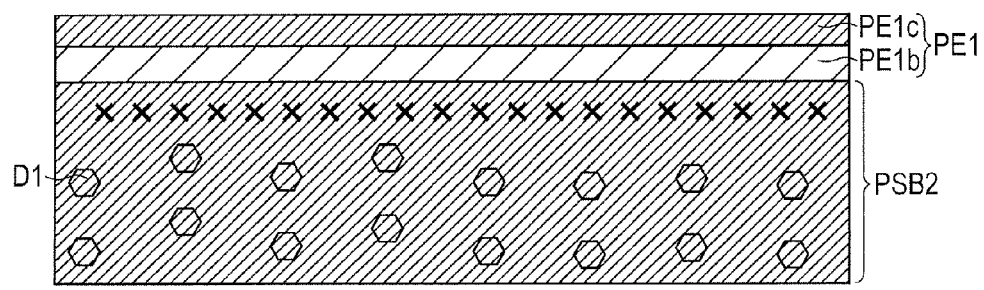
FIG. 24 is a schematic cross-sectional view showing a second step of the method of manufacturing a semiconductor device according to Third Embodiment.

As FIG. 24 shows, a first p type epitaxial layer PE1 comprised of a plurality of layers is formed by typical epitaxial growth over the main surface of the p type substrate PSB2. The term "a plurality of layers" as used herein means, for example, two layers formed by stacking, from the side close to the p type substrate PSB2, a lightly doped p type epitaxial layer PE1b and a heavily doped p type epitaxial layer PE1c in order of mention. The heavily doped p type epitaxial layer PE1c contains boron, as a p type impurity, at a concentration equivalent to that of boron in the first p type epitaxial layer PE1 of First Embodiment. The concentration of boron, for example, set at 4E17 $cm^{-3}$ or more but not more than 1E20 $cm^{-3}$ is preferred. The lightly doped p type epitaxial layer PE1b contains boron as a p type impurity at a concentration equivalent to that of boron in the second p type epitaxial layer PE2 of First Embodiment. The concentration of boron, for example, set at 5E14 $cm^{-3}$ or more but not more than 1E16 $cm^{-3}$ is preferred. By heat treatment, minute defect nuclei Dc1 may grow into minute defects D1.

Figure 25:
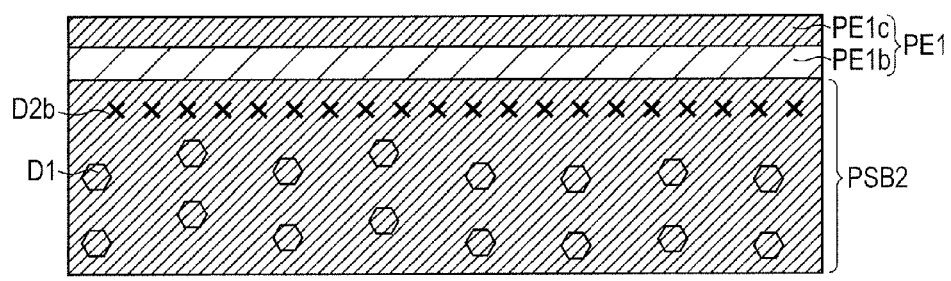
FIG. 25 is a schematic cross-sectional view showing a third step of the method of manufacturing a semiconductor device according to Third Embodiment.

As FIG. 25 shows, the structure formed in FIG. 24 is heat treated. By this heat treatment, oxygen (including minute defects D1) contained in the p type substrate PSB2 diffuses and reacts with boron, a p type impurity, in the p type substrate PSB2 to form defect complexes D2b in the p type substrate PSB2.

Figure 26:
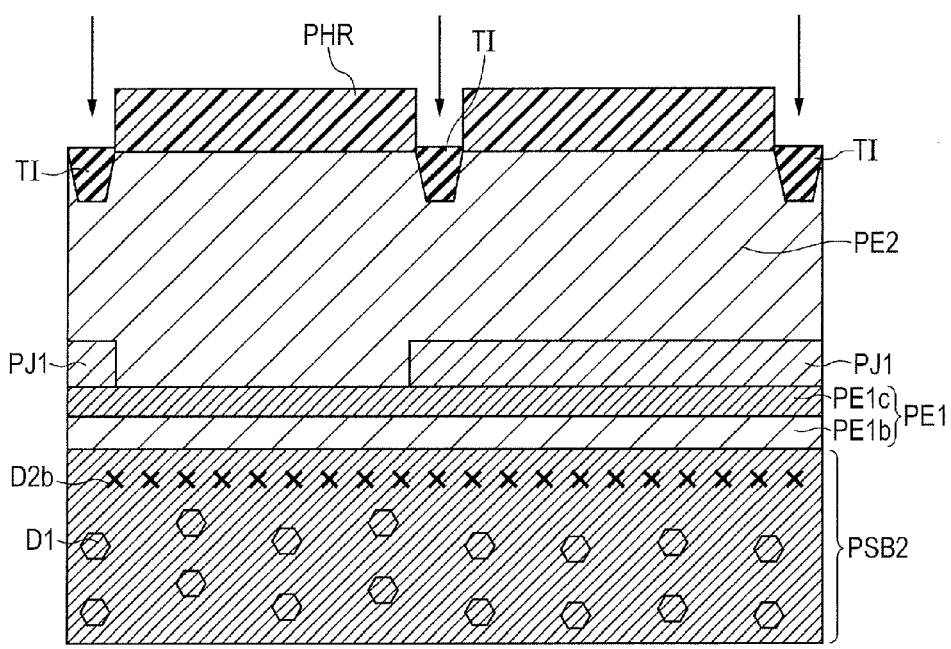
FIG. 26 is a schematic cross-sectional view showing a fourth step of the method of manufacturing a semiconductor device according to Third Embodiment.

As FIG. 26 shows, a second p type epitaxial layer PE2 made of silicon is formed so as to cover the upper surface of the first p type epitaxial layer PE1c. The second p type epitaxial layer PE2 also contains, for example, boron as a p type impurity. The concentration of boron, for example, set at 5E14 $cm^{-3}$ or more but not more than 1E16 $cm^{-3}$ is preferred. Thus, in the present embodiment, the p type impurity is formed in the p type substrate PSB2 so that the p type impurity concentration in the p type substrate PSB2 is higher than the p type impurity concentration in the second p type epitaxial layer PE2. Then, treatments similar to those of First Embodiment shown in FIGS. 8 to 10 are carried out, followed by a post-step similar to that of First Embodiment shown in FIG. 10 to form the structure shown in FIG. 22.

Next, the effect and advantage of the present embodiment will be described. The present embodiment has, in addition to the effect and advantage similar to those of Second Embodiment, the following effect and advantage.

In the present embodiment, the p type impurity concentration in the p type substrate PSB2 is set much higher than that of the second p type epitaxial layer PE2. More specifically, the p type impurity concentration in the p type substrate PSB2 is as high as that of the heavily doped p type epitaxial layer PE1a in Second Embodiment. The heavily doped p type epitaxial layer PE1a in Second Embodiment is therefore integrated with the semiconductor substrate (p type substrate PSB2). This makes it possible to omit a step of forming the heavily doped p type epitaxial layer PE1a, leading to a decrease in the number of steps and cost reduction.

In the present embodiment, since the p type impurity concentration of the p type substrate PSB2 is high, reactivity between the p type impurity in the p type substrate PSB2 and oxygen (including minute defect nuclei Dc1) in the p type substrate PSB2 can be enhanced, which is highly effective for forming defect complexes D2b in the p type substrate PSB2. Due to rich defect complexes D2b rich in the p type substrate PSB2, the carrier life time of electrons in the p type substrate PSB2 can be reduced.

Fourth Embodiment

Figure 27:
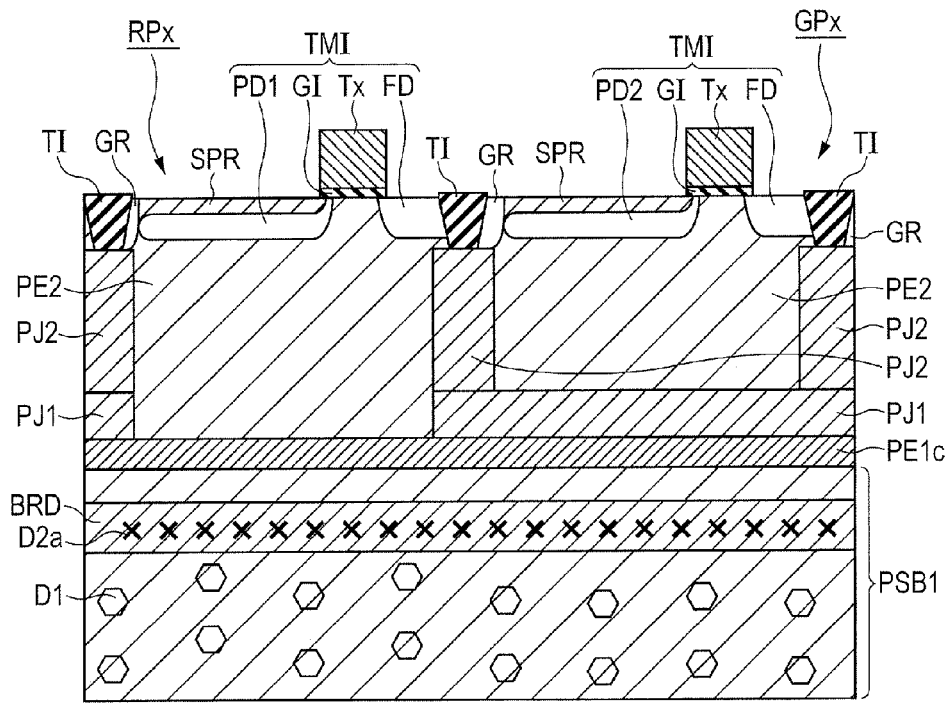
FIG. 27 is a schematic cross-sectional view showing the configuration of a pixel portion in Fourth Embodiment.

Referring to FIG. 27, the configuration of a photodiode PD making up a semiconductor imaging device as a semiconductor device of the present embodiment and a transfer transistor TMI including the photodiode PD will next be described in detail.

FIG. 27 is a schematic cross-sectional view showing a mode of a region same as that of First Embodiment shown in FIG. 4. As FIG. 27 shows, a plurality of extended defects D2a derived from an impurity element such as argon or silicon introduced into the p type substrate PSB1 configures a buried layer BRD in the p type substrate PSB1.

The buried layer BRD lies in a region deeper than the main surface of the p type substrate PSB1 and the buried layer BRD is not contiguous to the main surface of the p type substrate PSB1. Since the buried layer BRD contains a large number of impurity elements for forming extended defects D2a, the p type impurity concentration of the buried layer is higher than that of a portion of the p type substrate PSB1 other than the buried layer BRD.

Although the buried layer BRD lies in the p type substrate PSB1, it is similar to, for example, the heavily doped p type epitaxial layer PE1a of Second Embodiment from the standpoint of the p type impurity concentration. Since a region above the buried layer BRD (on the side of the second p type epitaxial layer PE2) is, similar to a region of the p type substrate PSB1 below the buried layer BRD in FIG. 27, a low p type impurity concentration region, it is similar to, for example, the lightly doped p type epitaxial layer PE1b of Second Embodiment from the standpoint of the p type impurity concentration. The p type substrate PSB1 has, over the main surface thereof, a single layer of the heavily-doped p type epitaxial layer PE1c similar to that of Second Embodiment.

The heavily doped p type epitaxial layer PE1a and the lightly doped p type epitaxial layer PE1b of Second Embodiment are presumed to be integrated with the p type substrate PSB1 in the present embodiment.

The buried layer BRD is a region formed by the implantation induced defects D2a formed in the p type substrate PSB1 so that the present embodiment has a configuration absolutely similar to the configuration of First Embodiment shown in FIG. 4 having the extended defects D2a (two or more) in the p type substrate PSB1. This means that in the present embodiment, the configuration of First Embodiment shown in FIG. 4 is described from a viewpoint different from that of FIG. 4 while paying attention to the heavily doped region (buried layer BRD) having therein the implantation induced defects D2a and the lightly doped region right above the heavily doped region in the p type substrate PSB1.

The configuration of the present embodiment other than the above-mentioned one is substantially similar to the configuration of First Embodiment shown in FIG. 4 so that like components are identified by like reference numerals and overlapping description is omitted.

Figure 28:
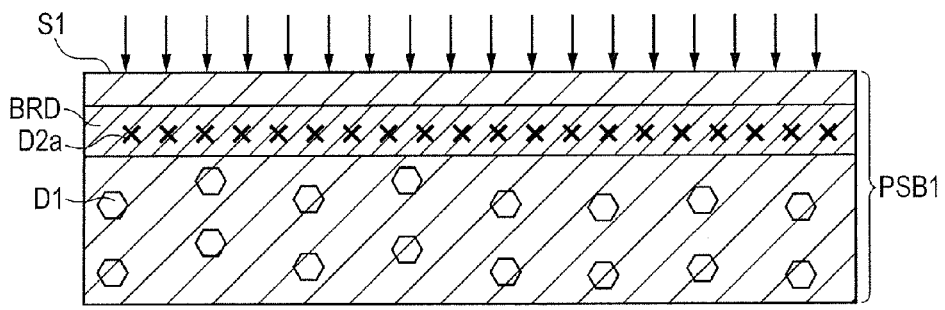
FIG. 28 is a schematic cross-sectional view showing a first step of a method of manufacturing a semiconductor device according to Fourth Embodiment.
Figure 29:
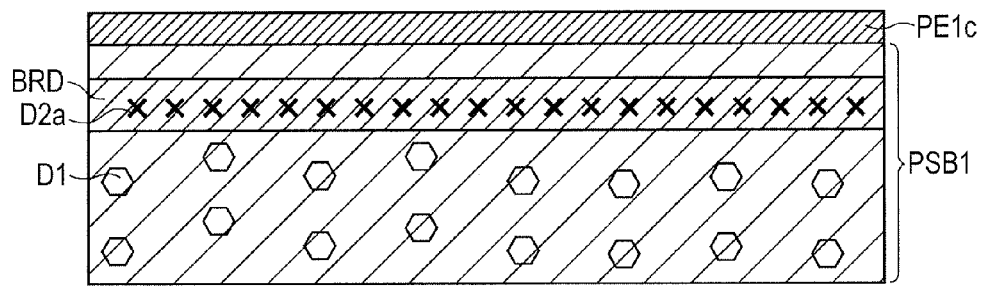
FIG. 29 is a schematic cross-sectional view showing a second step of the method of manufacturing a semiconductor device according to Fourth Embodiment.

Referring to FIGS. 28 and 29, a method of manufacturing the photodiode PD making up a semiconductor imaging device as the semiconductor device of the present embodiment and the transfer transistor TMI including the photodiode PD will be described. FIGS. 28 and 29 show a process of a region same as that of FIG. 27.

As FIG. 28 shows, after a p type substrate PSB1 is provided as in the step of FIG. 5, an impurity element, for example, boron is formed in the substrate (in a region slightly deeper than the main surface S1 of the p type substrate PSB1) by using typical ion implantation technology. The P type substrate PSB1 is heat treated in a generally known manner. Then, due to boron introduced as an impurity element, extended defects D2a such as dislocation loops are buried in the substrate. Also by this heat treatment, oxygen in the p type substrate PSB1 grows into minute defects D1.

As FIG. 29 shows, a first p type epitaxial layer PE1 (a heavily doped p type epitaxial layer PE1c similar to that of Second Embodiment) made of silicon is formed over the main surface S1 of the p type substrate PSB1 by typical epitaxial growth.

Treatments similar to those of First Embodiment shown in FIGS. 8 to 10 are carried out, followed by a post-step similar to that of First Embodiment shown FIG. 10 to form the structure shown in FIG. 27.

Next, the effect and advantage of the present embodiment will be described. The present embodiment exhibits, in addition to the effect and advantage similar to those of Second Embodiment, the following ones.

In the present embodiment, the heavily doped p type epitaxial layer PE1a and the lightly doped p type epitaxial layer PE1b in Second Embodiment are integrated with the semiconductor substrate (p type substrate PSB1). This makes it possible to omit a step of forming the heavily doped p type epitaxial layer PE1a and the lightly doped p type epitaxial layer PE1b, leading to a decrease in the number of steps and cost reduction.

Fifth Embodiment

Figure 30:
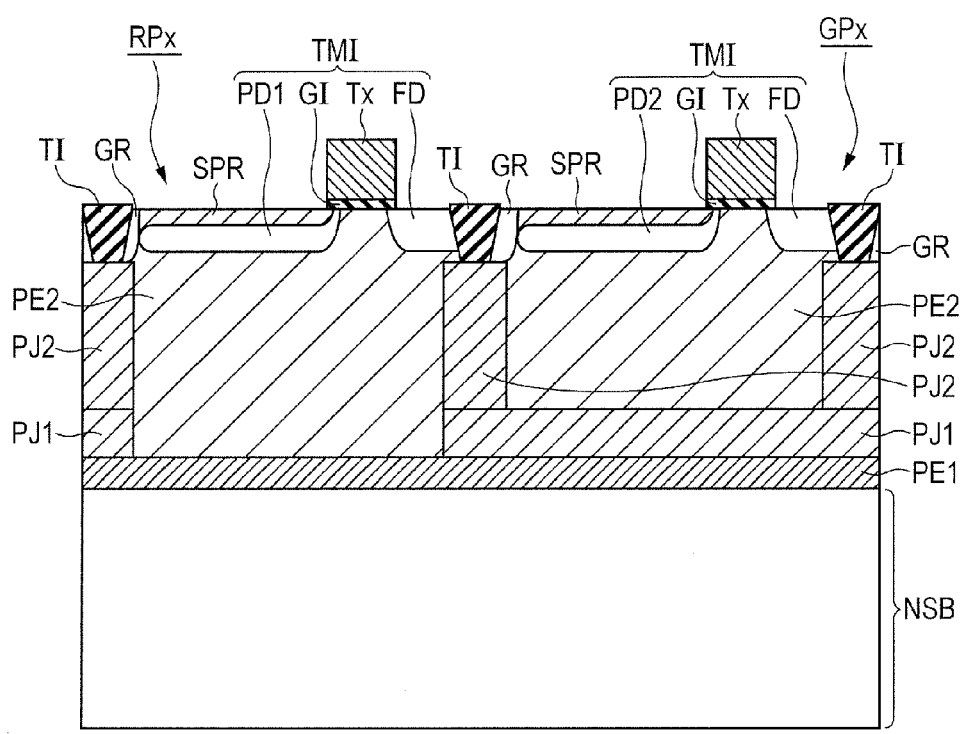
FIG. 30 is a schematic cross-sectional view showing the configuration of a pixel portion in Fifth Embodiment.

Referring to FIG. 30, the configuration of a photodiode PD making up a semiconductor imaging device as a semiconductor device of the present embodiment and a transfer transistor TMI including the photodiode PD will next be described in detail.

FIG. 30 is a schematic cross-sectional view showing a mode of a region same as that of FIG. 4 in First Embodiment. As FIG. 30 shows, the present embodiment uses an n type substrate NSB instead of the p type substrate PSB1. This means that the n type substrate NSB has an n type impurity element such as antimony, arsenic, or phosphorus introduced therein.

The configuration of the present embodiment except for the above-mentioned substrate is substantially similar to that of First Embodiment shown in FIG. 4 so that like components are identified by like reference numerals and an overlapping description is omitted.

The present embodiment uses an n type substrate NSB instead of the p type substrate PSB1 or PSB2 so that electrons generated by the photoelectric conversion of a long wavelength light in the n type substrate NSB are collected in the n type substrate NSB at a high ratio. It is therefore possible to suppress occurrence of crosstalk, that is, undesired collection of electrons, which have been generated by the photoelectric conversion, by the photodiode PD2 adjacent to the photodiode PD1 receiving the long wavelength light.

Sixth Embodiment

Figure 31:
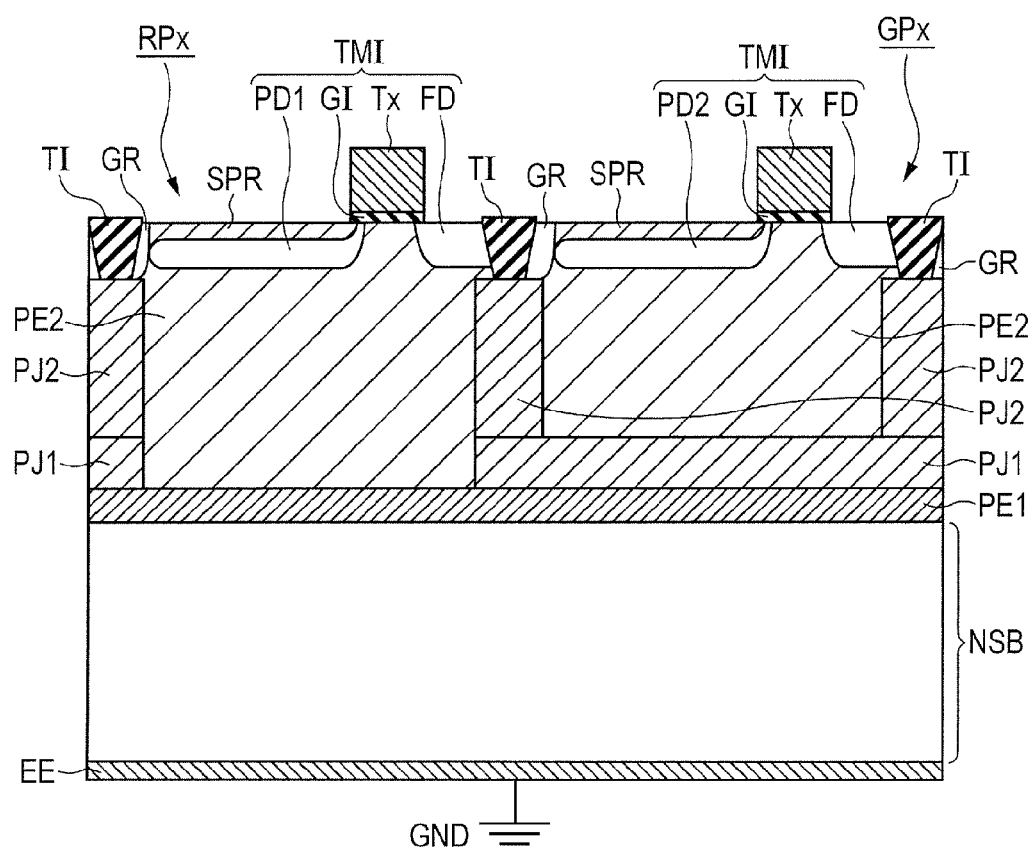
FIG. 31 is a schematic cross-sectional view showing the configuration of a pixel portion in Sixth Embodiment.

Referring to FIG. 31, the configuration of a photodiode PD making up a semiconductor imaging device as a semiconductor device of the present embodiment and a transfer transistor TMI including the photodiode PD will next be described in detail.

FIG. 31 is a schematic cross-sectional view showing a mode of a region same as that of First Embodiment shown in FIG. 4. As FIG. 31 shows, the present embodiment has a back electrode EE right below an n type substrate NSB. The back electrode EE is obtained by depositing a thin film of a metal material such as gold on the main surface on the underside of the n type substrate NSB.

The configuration of the present embodiment except for the above-mentioned back electrode is substantially similar to that of Fifth Embodiment shown in FIG. 30 so that like components are identified by like reference numerals and an overlapping description is omitted.

In the configuration of Fifth Embodiment shown in FIG. 30, when a large number of electrons are generated in the n type substrate NSB due to particularly active photoelectric conversion and in addition, the electrons in the n type substrate NSB have a long lifetime, some of the electrons in the n type substrate NSB may penetrate into, for example, the first implantation region PJ1. This occurs because the n type substrate NSB cannot allow the electrons to escape therefrom and a so-called floating state appears in the n type substrate NSB. Penetration of electrons into the first implantation region PJ1 may cause crosstalk by the electrons.

As shown in FIG. 31, by forming the back electrode EE right below the n type substrate NSB and applying a ground potential GND to it to fix the potential of the n type substrate NSB, excessive electrons generated in the n type substrate NSB can therefore be introduced into the side of the ground potential GND from the back electrode EE. This can lessen the possibility of excessive electrons in the n type substrate NSB causing crosstalk.

Seventh Embodiment

Figure 32:
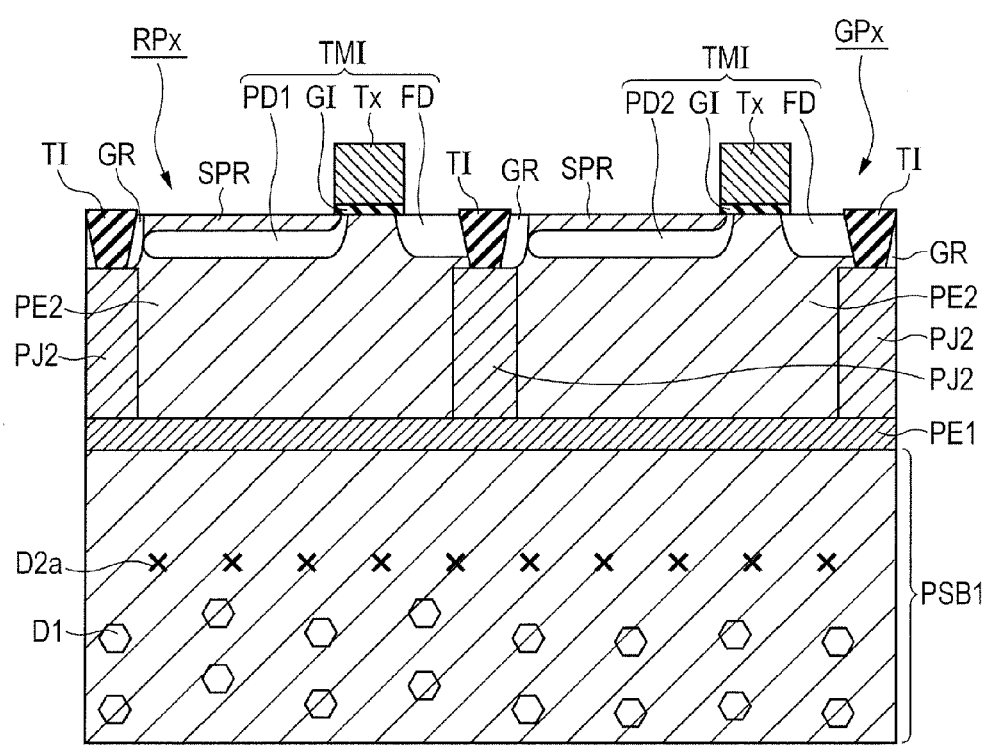
FIG. 32 is a schematic cross-sectional view showing the configuration of a pixel portion in Seventh Embodiment.

Referring to FIG. 32, the configuration of a photodiode PD making up a semiconductor imaging device as a semiconductor device of the present embodiment and a transfer transistor TMI including the photodiode PD will next be described in detail.

FIG. 32 is a schematic cross-sectional view showing a mode of a region same as that of First Embodiment shown in FIG. 4. As FIG. 32 shows, the present embodiment has essentially a configuration similar to that of First Embodiment shown in FIG. 4, but the present embodiment differs from First Embodiment in the following point.

Described specifically, as FIG. 32 shows, the present embodiment does not have the first implantation region PJ1 formed in FIG. 4 but has a second epitaxial layer PE2 so as to cover the upper surface of the first p type epitaxial layer PE1 below both the photodiode PD1 and the photodiode PD2. The thickness of the second p type epitaxial layer PE2 in the first pixel region RPx is substantially equal to the thickness of the second p type epitaxial layer PE2 in the second pixel region GPx. Further, the second implantation region PJ2 reaches the first p type epitaxial layer PE1 and it is brought into contact with the first p type epitaxial layer PE1.

The second p type epitaxial layer PE2 shown in FIG. 32 is preferably thinner than the second p type epitaxial layer PE2 shown in FIG. 4. For example, the thickness of the second p type epitaxial layer PE2 in FIG. 32 is preferably substantially equal to that of the second p type epitaxial layer PE2 in the second pixel region GPx (except the first implantation region PJ1) in FIG. 4.

The configuration of the present embodiment except for the above-mentioned point is substantially similar to that of First Embodiment shown in FIG. 4 so that like components are identified by like reference numerals and an overlapping description is omitted.

Figure 33:
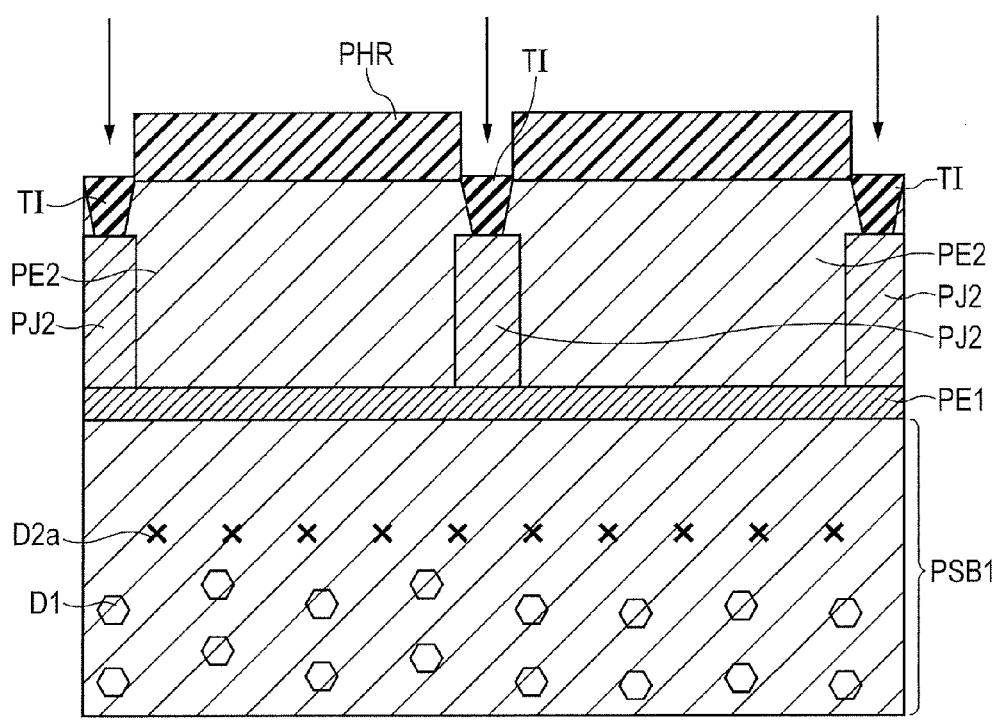
FIG. 33 is a schematic cross-sectional view showing one step of a method of manufacturing a semiconductor device of Seventh Embodiment.

Referring to FIG. 33, a method of manufacturing the photodiode PD making up a semiconductor imaging device as the semiconductor device of the present embodiment and the transfer transistor TMI including the photodiode PD will next be described. In FIG. 33, a process of a region similar to that of FIG. 32 is shown.

As FIG. 33 shows, after treatments similar to those of First Embodiment shown in FIGS. 5 to 7, a second p type epitaxial layer PE2 is formed so as to cover the upper surface of the first p type epitaxial layer PE1 below both a formation region of a photodiode PD1 and a formation region of a photodiode PD2. In other words, the second p type epitaxial layer PE2 is formed so as to cover the upper surface of the first p type epitaxial layer PE1 in both a formation region of a first pixel region RPx and a formation region of a second pixel region GPx.

In the present embodiment, the thickness of the second p type epitaxial layer PE2 is preferably smaller than that of the second p type epitaxial layer PE2 formed, for example, in the step of FIG. 8.

After formation of the second p type epitaxial layer, treatments similar to those of First Embodiment shown in FIGS. 8 to 10 and then a post-step similar to that of First Embodiment shown in FIG. 10 are carried out to form the structure shown in FIG. 32.

The present embodiment does not have the first implantation region PJ1 so that the number of masks to be provided, manufacturing tact time, and manufacturing cost can be reduced.

Eighth Embodiment

Figure 34:
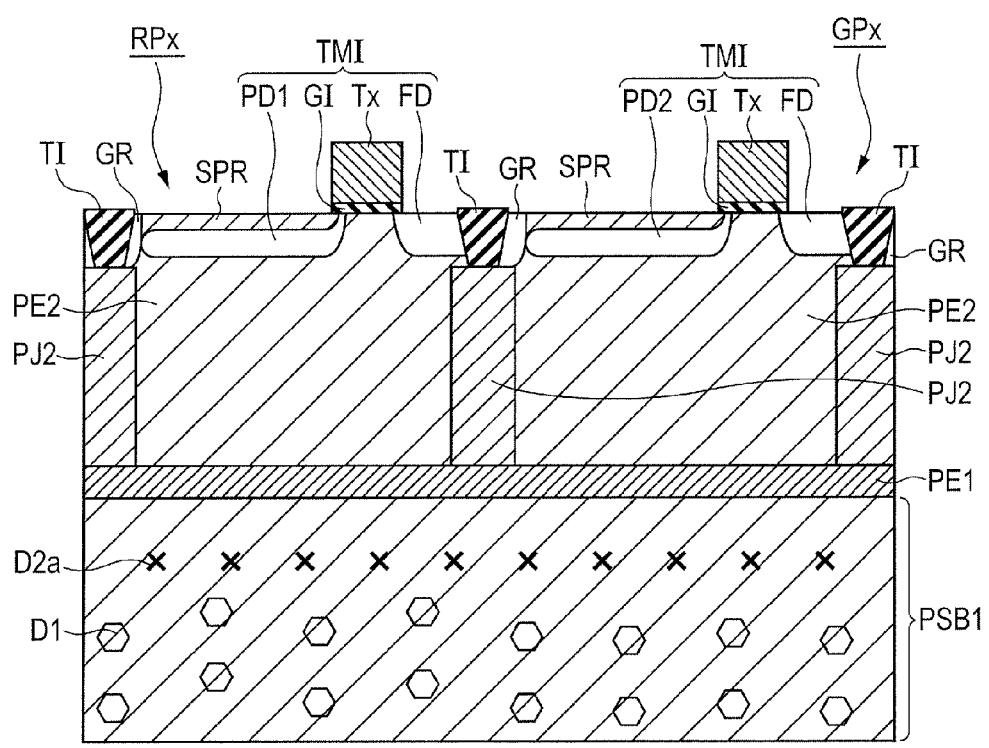
FIG. 34 is a schematic cross-sectional view showing the configuration of a pixel portion in Eighth Embodiment.

Referring to FIG. 34, the configuration of a photodiode PD making up a semiconductor imaging device as s semi-conductor device of the present embodiment and a transfer transistor TMI including the photodiode PD will next be described in detail.

FIG. 34 is a schematic cross-sectional view showing a mode of a region same as that of First Embodiment shown in FIG. 4. As FIG. 34 shows, the present embodiment has a configuration similar to that of Seventh Embodiment shown in FIG. 32, but energy supplied by the ion implantation technology upon forming the second implantation region PJ2 is higher than that of FIG. 32.

Increasing the energy can enhance the function, as a potential barrier, of the second implantation region PJ2 of FIG. 34 for suppressing transfer of electrons in the second p type epitaxial layer PE2, which have been generated by the photoelectric conversion, between the first pixel region RPx and the second pixel region GPx, compared with the second implantation region PJ2 of FIG. 32.

The thickness of the second p type epitaxial layer PE2 in FIG. 34 may be made greater than that of FIG. 32. Since the energy for forming the second implantation region PJ2 in the present embodiment is higher than that in Seventh Embodiment, the second implantation region PJ2 in the present embodiment can have a greater depth than that in Seventh Embodiment. Even if the thickness of the second p type epitaxial layer PE2 is made greater, by forming the second implantation region PJ2 so as to be brought into contact with the first p type epitaxial layer PE1, it is possible to enhance an effect of suppressing crosstalk of electrons in the second p type epitaxial layer PE2 in the second pixel region GPx. Since the thickness of the second p type epitaxial layer PE2 can be made greater, a generation region of photoelectrically converted electrons which can be collected by the photodiode PD1 can be widened, making it possible to improve the sensitivity of the photodiode PD1.

Ninth Embodiment

Figure 35:
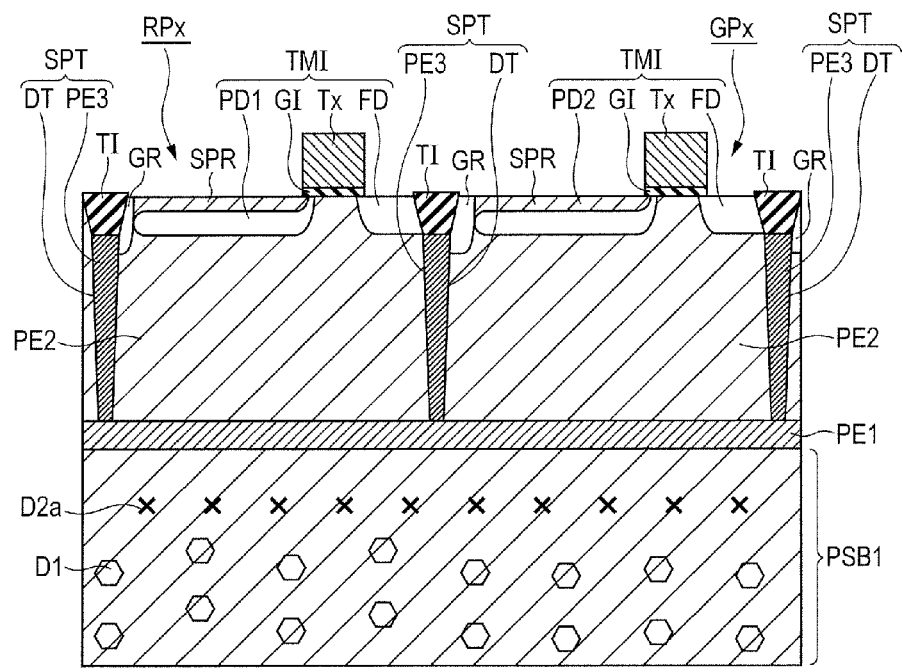
FIG. 35 is a schematic cross-sectional view showing the configuration of a pixel portion in Ninth Embodiment.

Referring to FIG. 35, the configuration of a photodiode PD making up a semiconductor imaging device as s semi-conductor device of the present embodiment and a transfer transistor TMI including the photodiode PD will next be described in detail.

FIG. 35 is a schematic cross-sectional view showing a mode of a region same as that of First Embodiment shown in FIG. 4. As FIG. 35 shows, the present embodiment has a pixel isolation region SPT right below the trench isolation TI at the boundary portion between the first pixel region RPx and the second pixel region GPx. The pixel isolation region SPT is comprised of a deep trench DT and a third p type epitaxial layer PE3.

The deep trench DT is a trench penetrating through the second p type epitaxial layer PE2 and reaching the first p type epitaxial layer PE1 at the boundary portion between the first pixel region RPx and the second pixel region GPx. The deep trench DT is preferably brought into contact with the lowermost portion of the trench isolation TI.

The deep trench DT has therein a third p type epitaxial layer PE3 as a p type semiconductor layer. In other words, the deep trench DT is filled with the third p type epitaxial layer PE3 as a p type semiconductor layer. The third p type epitaxial layer PE3 corresponds to the second implantation region PJ2 as a second p type impurity region in each of the above-mentioned embodiments and functions like the second implantation region PJ2.

Similar to Seventh or Eighth Embodiment, the present embodiment does not have the first implantation region PJ1 in the second pixel region GPx.

The configuration of the present embodiment except for the above-mentioned point is substantially similar to that of First Embodiment shown in FIG. 4 so that like components are identified by like reference numerals and an overlapping description is omitted.

Figure 36:
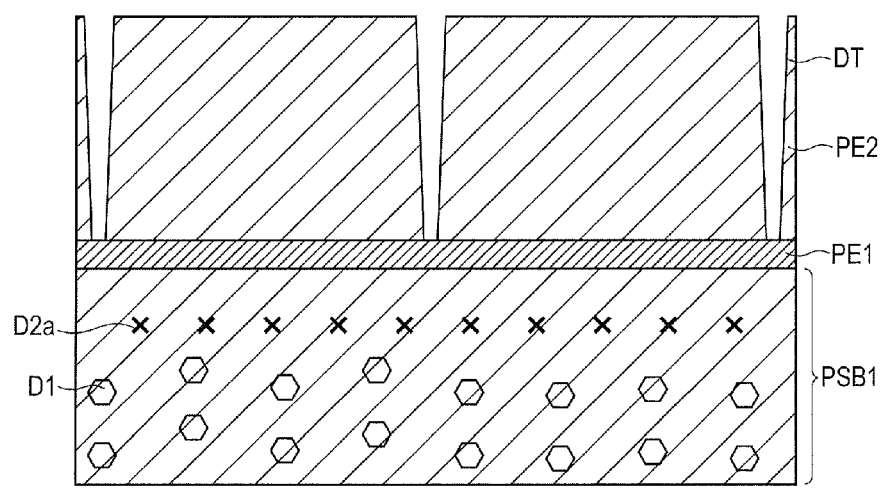
FIG. 36 is a schematic cross-sectional view showing a first step of a method of manufacturing a semiconductor device according to Ninth Embodiment.
Figure 37:
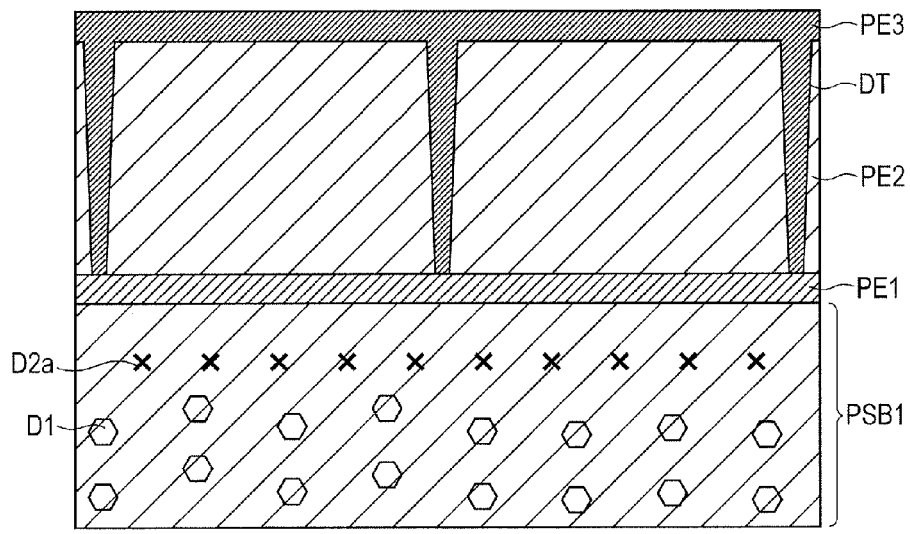
FIG. 37 is a schematic cross-sectional view showing a second step of the method of manufacturing a semiconductor device according to Ninth Embodiment.
Figure 38:
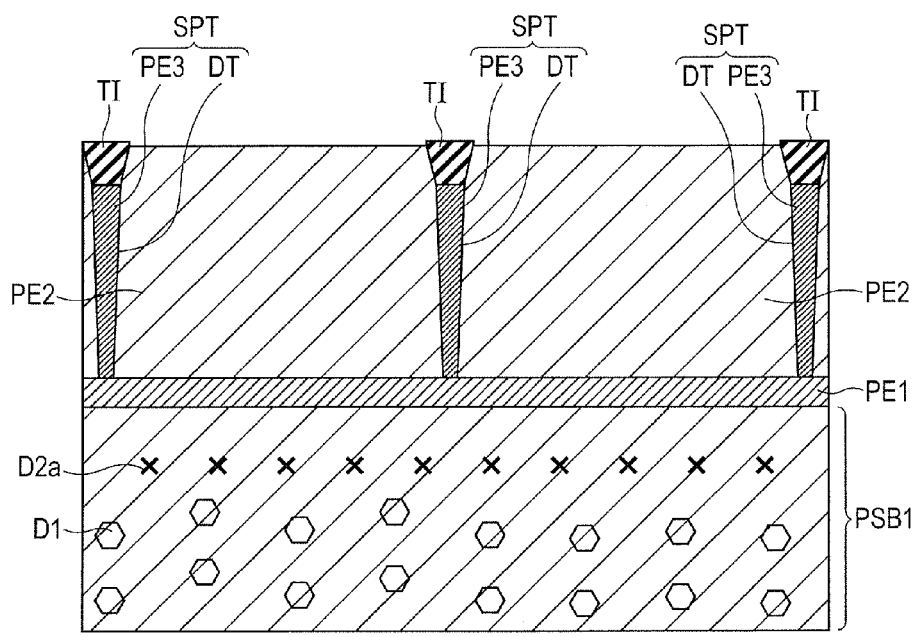
FIG. 38 is a schematic cross-sectional view showing a third step of the method of manufacturing a semiconductor device according to Ninth Embodiment.

Referring to FIGS. 36 to 38, a method of manufacturing the photodiode PD making up a semiconductor imaging device as the semiconductor device of the present embodiment and the transfer transistor TMI including the photodiode PD will next be described.

As FIG. 36 shows, after treatments similar to those of First Embodiment shown in FIGS. 5 to 7, a second p type epitaxial layer PE2 is formed in a step similar to that of FIG. 8. Then, a deep trench DT penetrating through the second p type epitaxial layer PE2 so as to reach the first p type epitaxial layer PE1 is formed in the second p type epitaxial layer PE2 at a boundary portion between a formation region of the first pixel region RPx and a formation region of a second pixel region GPx by using typical photolithography and etching.

As FIG. 37 shows, a third p type epitaxial layer PE3 is formed on the upper surface of the second p type epitaxial layer PE2 to fill the deep trench DT therewith by typical epitaxial growth.

As FIG. 38 shows, the third p type epitaxial layer PE3 over the second p type epitaxial layer PE2 is removed using chemical mechanical polishing called CMP. Thus, a pixel isolation region SPT is formed at the boundary portion between a formation region of the first pixel region RPx and a formation region of the second pixel region GPx. A shallow trench is then formed right above the pixel isolation region SPT in the second p type epitaxial layer PE2 by typical photolithography and etching. Then, an insulating film such as a silicon oxide film is formed on the upper surface of the second p type epitaxial layer PE2 by using, for example, typical CVD to fill the shallow trench.

Then, the insulating film on the second p type epitaxial layer PE2 is removed again by using CMP to form a trench isolation TI right above the pixel isolation region SPT.

Treatments similar to those of First Embodiment shown in FIGS. 9 to 10 are then carried out, followed by a post-step of FIG. 10 similar to that of First Embodiment to form the structure shown in FIG. 35.

The effect and advantage of the present embodiment will next be described. As the present embodiment, instead of the second implantation region PJ2, a potential barrier between the first pixel region RPx and the second pixel region GPx may be formed by the third p type epitaxial layer PE3 filled in the deep trench DT. Since the third p type epitaxial layer PE3 is formed by epitaxial growth, the third p type epitaxial layer PE3 can be formed freely so as to have a p type impurity concentration higher than that of the second implantation region PJ2 formed by the ion implantation technology. The pixel isolation region SPT therefore becomes more effective for suppressing electronic crosstalk.

Tenth Embodiment

Figure 39:
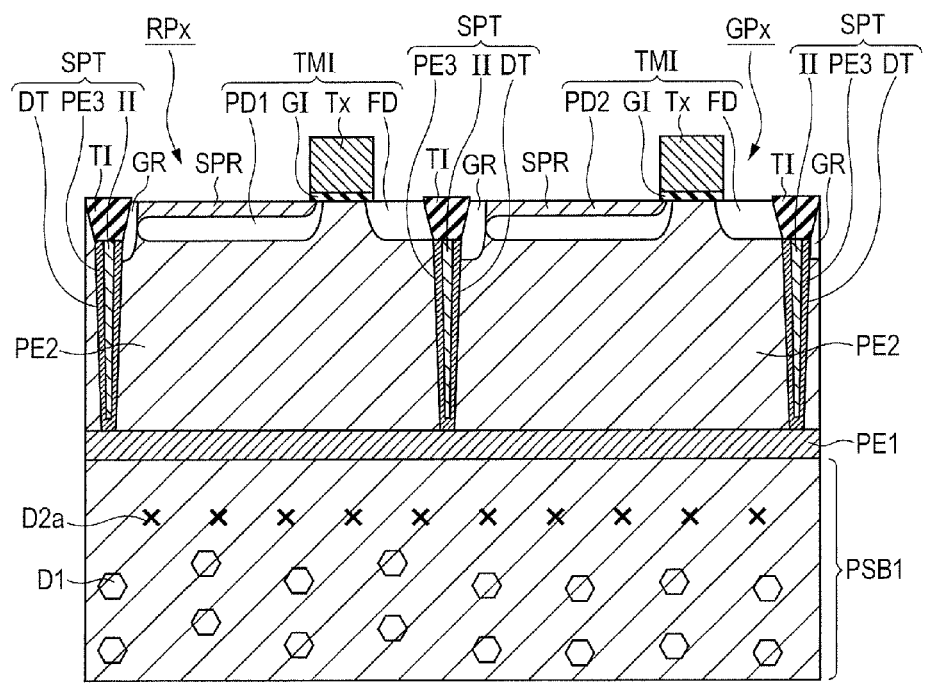
FIG. 39 is a schematic cross-sectional view showing the configuration of a pixel portion in Tenth Embodiment.

Referring to FIG. 39, the configuration of a photodiode PD making up a semiconductor imaging device as a semiconductor device of the present embodiment and a transfer transistor TMI including the photodiode PD will next be described in detail.

FIG. 39 is a schematic cross-sectional view showing a mode of a region same as that of First Embodiment shown in FIG. 4. As FIG. 39 shows, the present embodiment has a configuration essentially similar to that of Ninth Embodiment shown in FIG. 35, but a deep trench DT configuring the pixel isolation region SPT is filled with a third p type epitaxial layer PE3 and an insulating film II.

The deep trench DT is filled, in an outer portion thereof, with the third epitaxial layer PE3 and a portion of the trench inside the third epitaxial layer PE3 is filled with the insulating film II. In other words, the third epitaxial layer PE3 in the deep trench DT has, on the epitaxial layer, the insulating film II. The insulating film II is made of, for example, a silicon oxide film. This means that the pixel isolation region SPT of the present embodiment is comprised of the deep trench DT, the third p type epitaxial layer PE3, and the insulating film II.

The configuration of the present embodiment except for the above-mentioned point is substantially similar to that of Ninth Embodiment shown in FIG. 35 so that like components are identified by like reference numerals and an overlapping description is omitted.

Figure 40:
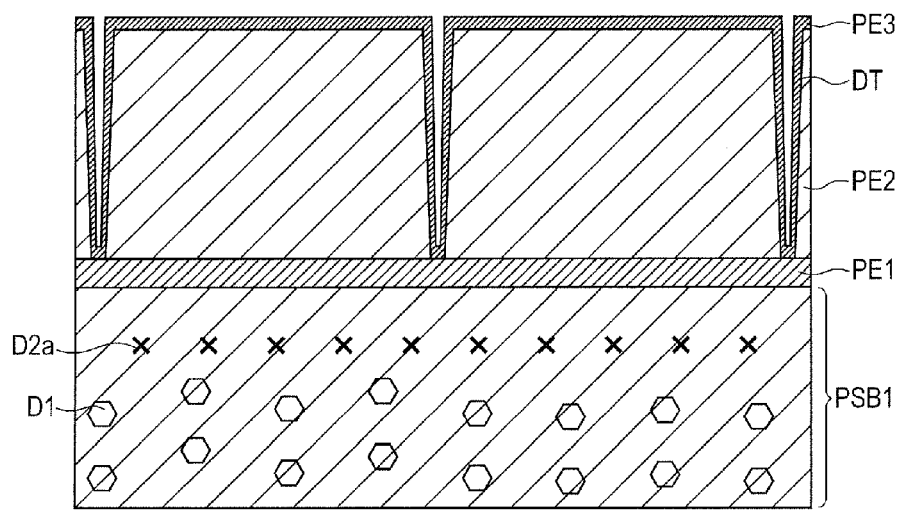
FIG. 40 is a schematic cross-sectional view showing a first step of a method of manufacturing a semiconductor device according to Tenth Embodiment.
Figure 41:
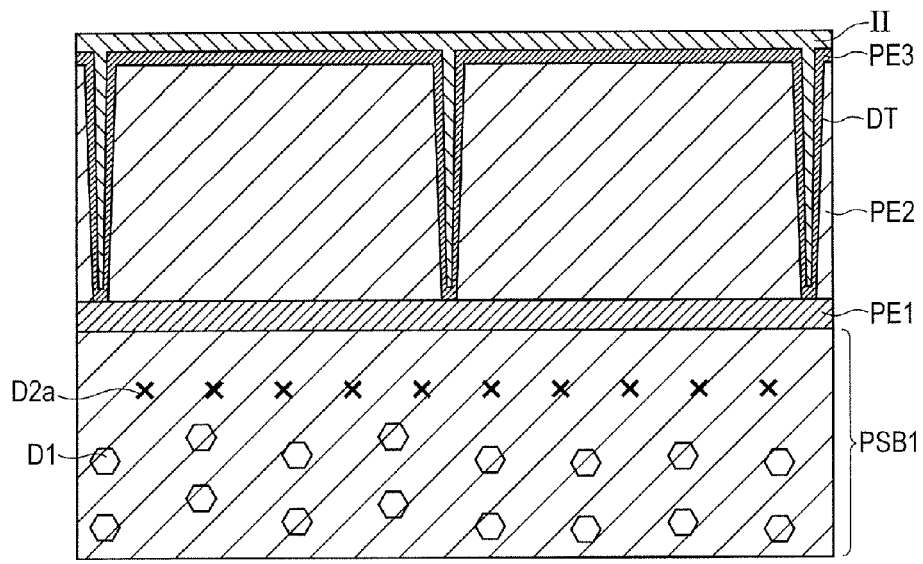
FIG. 41 is a schematic cross-sectional view showing a second step of the method of manufacturing a semiconductor device according to Tenth Embodiment.
Figure 42:
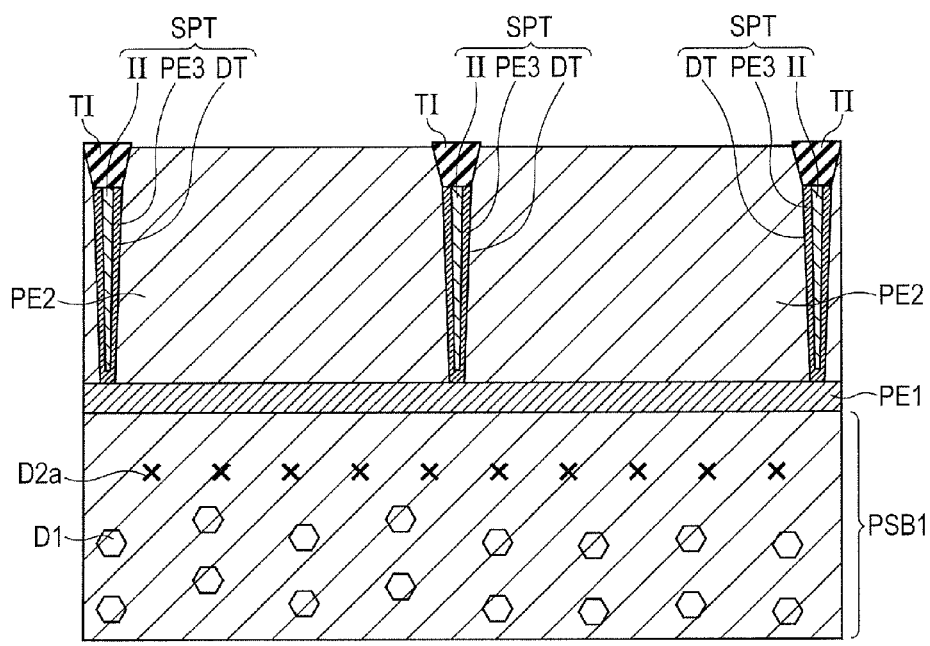
FIG. 42 is a schematic cross-sectional view showing a third step of the method of manufacturing a semiconductor device according to Tenth Embodiment.

Referring to FIGS. 40 to 42, a method of manufacturing the photodiode PD making up a semiconductor imaging device as the semiconductor device of the present embodiment and the transfer transistor TMI including the photodiode PD will next be described.

As FIG. 40 shows, after formation of the deep trench DT in the second p type epitaxial layer PE2 as in Ninth Embodiment shown in FIG. 36, a third p type epitaxial layer PE3 is formed over the second p type epitaxial layer PE2 so as to cover the inner wall of the deep trench DT by using typical epitaxial growth.

As FIG. 41 shows, an insulating film II made of, for example, a silicon oxide film is formed by application so as to cover the third p type epitaxial layer PE3 on the second p type epitaxial layer PE2 and in the deep trench DT. The deep trench DT is filled with the insulating film II and the third p type epitaxial layer PE3.

As shown in FIG. 42, the third p type epitaxial layer PE3 and the insulating film II over the second p type epitaxial layer PE2 are removed using CMP. In such a manner, a pixel isolation region SPT is formed at a boundary portion between a formation region of the first pixel region RPx and a formation region of the second pixel region GPx.

Treatments similar to those after formation of the pixel isolation region SPT in Ninth Embodiment are thereafter carried out to form a trench isolation TI right above the image isolation region SPT. Then, treatments similar to those of First Embodiment shown in FIGS. 9 to 10 are carried out, followed by a post-step of FIG. 10 in a manner similar to that of First Embodiment to form the structure shown in FIG. 42.

The effect and advantage of the present embodiment will next be described.

A markedly high aspect ratio of the deep trench DT may prevent complete filling of the trench, for example, only with the third p type epitaxial layer PE3 as in Ninth Embodiment. The deep trench DT to which the insulating film II is applied so as to fill therewith the space of the trench is supplied as in the present embodiment. This makes it possible to fill the deep trench DT more completely to enhance the effect of the pixel isolation region SPT for suppressing electronic crosstalk.

Eleventh Embodiment

Figure 43:
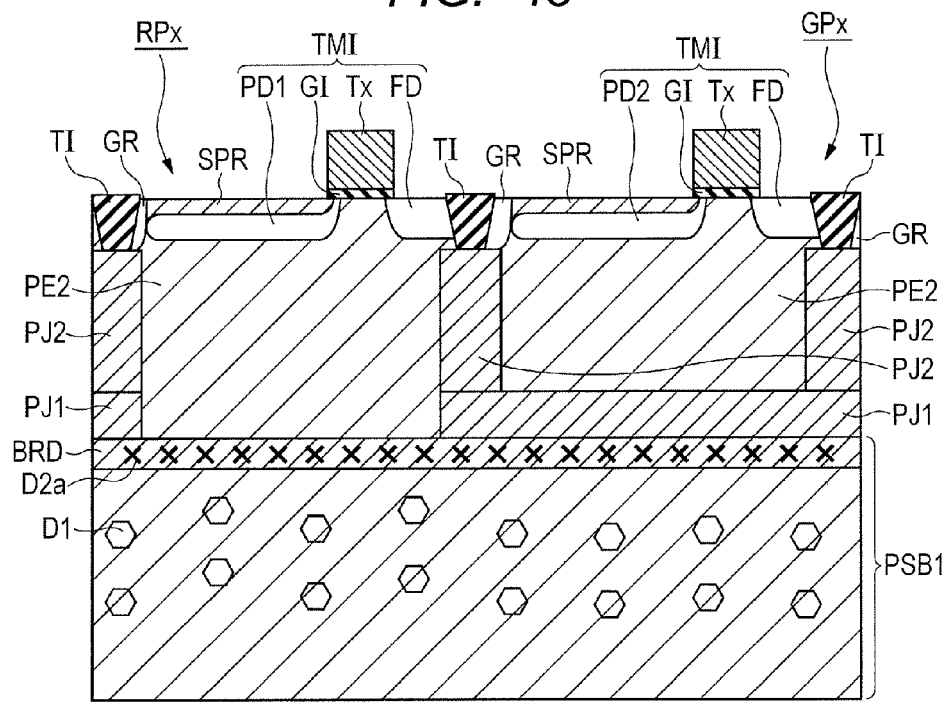
FIG. 43 is a schematic cross-sectional view showing the configuration of a pixel portion in Eleventh Embodiment.

Referring to FIG. 43, the configuration of a photodiode PD making up a semiconductor imaging device as a semiconductor device of the present embodiment and a transfer transistor TMI including the photodiode PD will next be described in detail.

FIG. 43 is a schematic cross-sectional view showing a mode of a region same as that of First Embodiment shown in FIG. 4. As FIG. 43 shows, the present embodiment has a buried layer BRD (buried impurity layer) in the p type substrate PSB1 having a main surface, particularly in a relatively upper region of the p type substrate PSB1.

The buried layer BRD is a layer containing a number of extended defects D2a obtained by heat treating a p type impurity element such as boron introduced into the semiconductor substrate PSB1. From this viewpoint, therefore, the buried layer BRD of the present embodiment has a configuration and a function similar to those of, for example, the buried layer BRD of Fourth Embodiment shown in FIG. 27.

The configuration above the buried layer BRD is similar to that of First Embodiment shown in FIG. 4. Described specifically, the buried layer BRD has thereon a second p type epitaxial layer PE2 (p type epitaxial layer) and the second p type epitaxial layer PE2 has therein a first pixel region RPx having a photodiode PD1 and a second pixel region GPx having a photodiode PD2. In the second pixel region GPx, the second p type epitaxial layer has therein a first implantation region PJ1 so as to cover the upper surface of the buried layer BRD therewith. The first pixel region RPx and the second pixel region GPx have, at a boundary portion therebetween, a second implantation region PJ2.

The above-mentioned embodiments each have, on the semiconductor substrate SUB thereof, a configuration having two epitaxial layers made of silicon, that is, the first p type epitaxial layer PE1 and the second p type epitaxial layer PE2. In the present embodiment, however, the epitaxial layer formed over the semiconductor substrate SUB is only one layer, that is, the second p type epitaxial layer PE2. In the present embodiment, the buried layer BRD having a p type impurity concentration higher than that of the second p type epitaxial layer PE2 is formed, instead of the first p type epitaxial layer PE1, in the p type substrate PSB1 made of silicon. Thus, similar to the first p type epitaxial layer PE1, it has a function as a potential barrier for suppressing electrons generated in the P type substrate PSB1 from proceeding to the second p type epitaxial layer PE2.

As described above, the present embodiment is different from First Embodiment having the first type epitaxial layer PE1 in that the buried layer BRD is formed in the p type substrate PSB1. It has however a configuration essentially similar to that of First Embodiment and the first p type epitaxial layer PE1 of First Embodiment is replaced by the buried layer BRD.

The configuration of the present embodiment except for the above-mentioned point is substantially similar to that of First Embodiment shown in FIG. 4 so that like components are identified by like reference numerals and an overlapping description is omitted.

Figure 44:
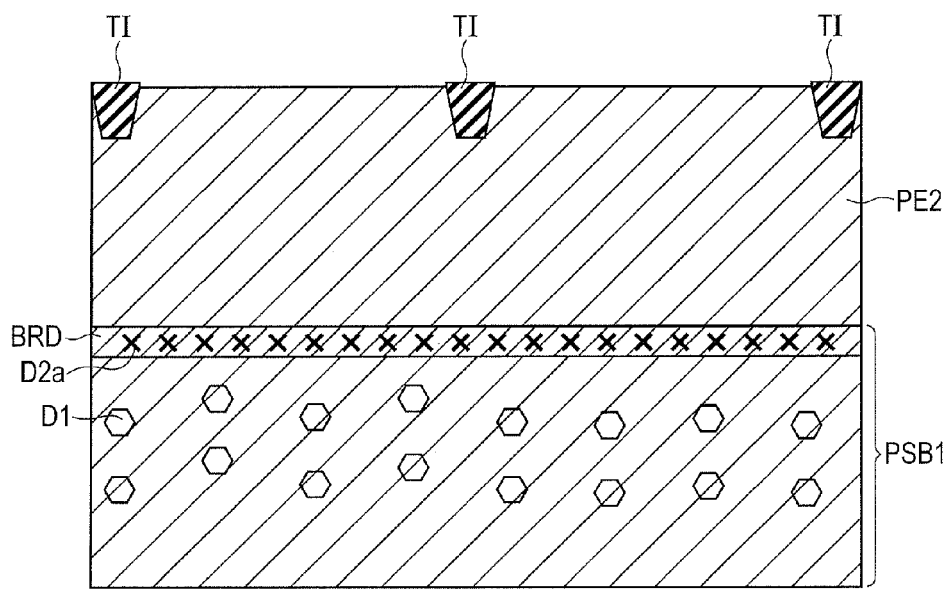
FIG. 44 is a schematic cross-sectional view showing a first step of a method of manufacturing a semiconductor device according to Eleventh Embodiment.
Figure 45:
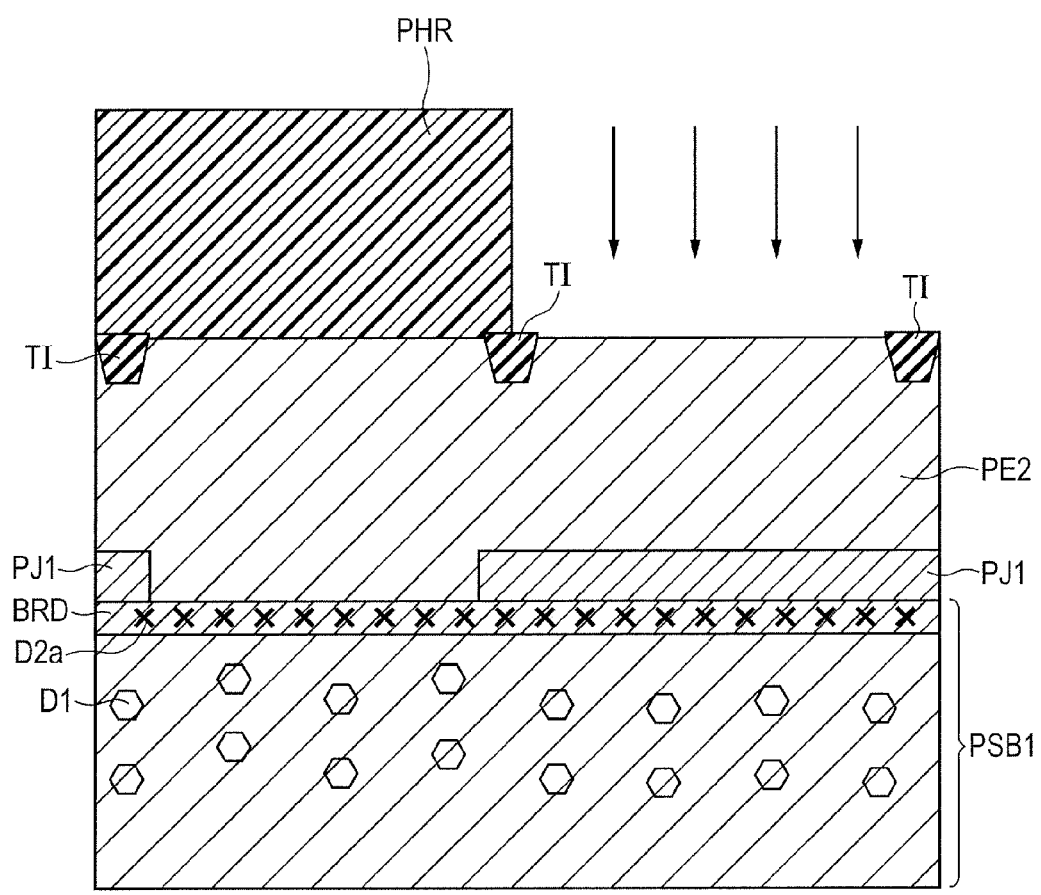
FIG. 45 is a schematic cross-sectional view showing a second step of the method of manufacturing a semiconductor device according to Eleventh Embodiment.

Referring to FIGS. 44 and 45, a method of manufacturing the photodiode PD making up a semiconductor imaging device as the semiconductor device of the present embodiment and the transfer transistor TMI including the photodiode PD will next be described. In FIGS. 44 and 45, a process of a region similar to that of FIG. 43 is shown.

As FIG. 44 shows, similar to First Embodiment shown in FIGS. 5 and 6, a p type substrate PSB1 which is a p type substrate made of, for example, silicon and having a main surface S1 is provided. An impurity element, for example, boron is introduced into the p type substrate PSB1 from above the main surface S1 of the p type substrate PSB1 by using typical ion implantation technology. Then, heat treatment is carried out to bury the thus-introduced impurity element such as boron as extended defects D2a such as so-called dislocation loops. A region rich in the thus-introduced impurity element such as boron is formed as a buried layer BRD. The buried layer BRD is formed to have a p type impurity concentration higher than that of a second p type epitaxial layer PE2 which will be described later.

Next, a second p type epitaxial layer PE2 made of silicon is formed on the buried layer BRD. The buried layer BRD in the present embodiment is formed in a relatively upper portion of the p type substrate PSB1. The uppermost portion of the buried layer BRD and the main surface S1 on the upper side of the p type substrate PSB1 have therebetween a region having an impurity concentration equal to that of a typical p type substrate PSB1 and having no buried layer BRD. The second p type epitaxial layer PE2 has however a p type impurity concentration essentially equivalent to that of the p type substrate PSB1 and they are common because the substrate is formed as a p type substrate by using an impurity, for example, boron. Therefore, a boundary between the p type substrate PSB1 and the second p type epitaxial layer PE2 substantially disappears, meaning that the second p type epitaxial layer PE2 is formed so as to cover therewith the upper surface of the buried layer BRD.

As FIG. 45 shows, similar to First Embodiment shown in FIGS. 8 to 10, a photodiode PD1 and so on are formed in the second p type epitaxial layer PE2, followed by a post-step similar to that of First Embodiment shown in FIG. 10 to obtain the structure shown in FIG. 43.

The effect and the advantage of the present embodiment will next be described.

In the present embodiment, only the second p type epitaxial layer PE2 is formed as a p type epitaxial layer and the buried layer BRD is formed using ion plantation technology instead of the first p type epitaxial layer PE1 in another embodiment. Formation of a potential barrier by using ion implantation technology can reduce a cost compared with formation of a potential barrier using epitaxial growth.

At the end, the key point of one embodiment will be described.

Figure 46:
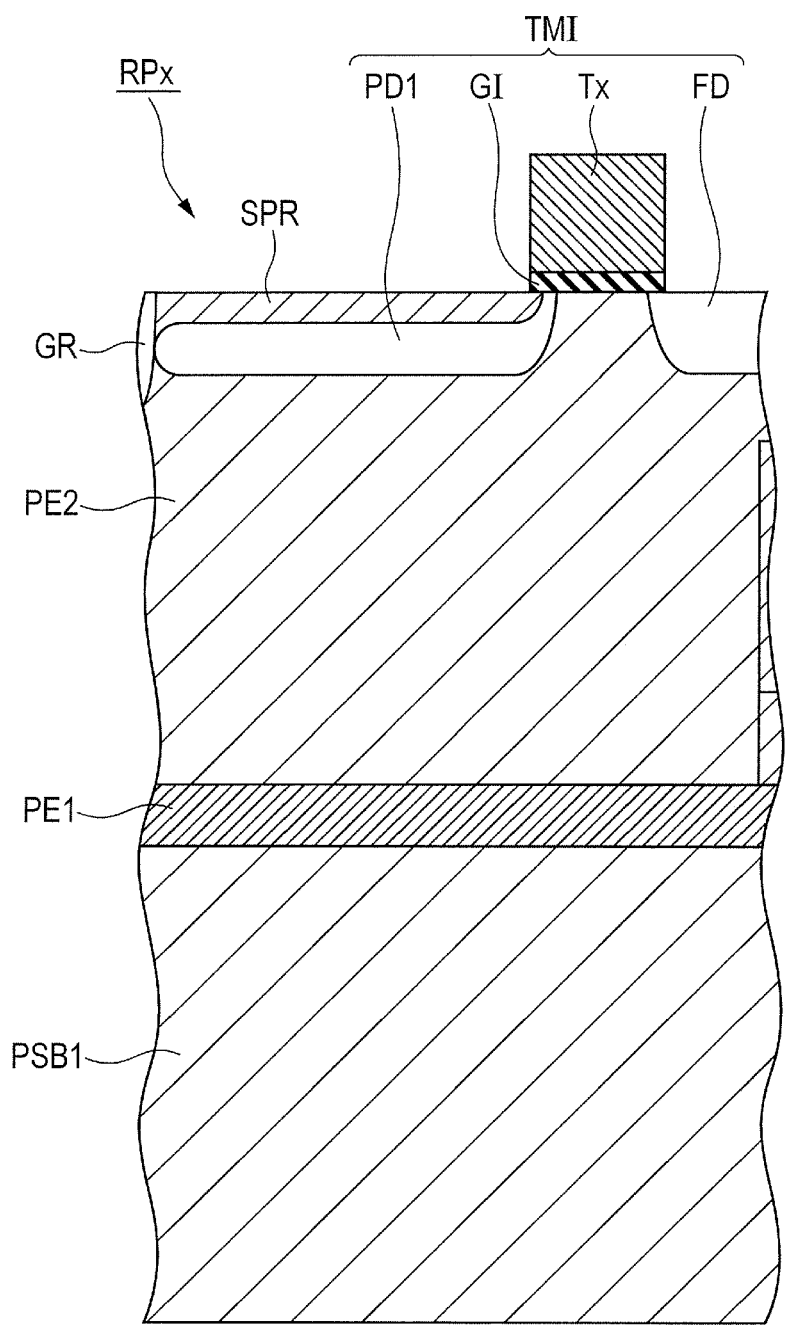
FIG. 46 is a schematic cross-sectional view showing an essential point of the configuration of the pixel portion of the semiconductor device according to the one embodiment.

As FIG. 46 shows, the semiconductor device of the one embodiment has a semiconductor substrate PSB1 having a main surface, a first p type epitaxial layer PE1 formed over the main surface, a second p type epitaxial layer PE2 formed to cover the upper surface of the first epitaxial layer PE1, and a first photoelectric conversion element PD1 formed in the second p type epitaxial layer PE2. The first and second p type epitaxial layers PE1 and PE2 are each made of silicon. The first p type epitaxial layer PE1 has a p type impurity concentration higher than that of the second p type epitaxial layer PE2. The configuration shown in FIG. 46 except for the above-described one is similar to that shown in FIG. 4.

Some of the details described in the embodiments will next be described, though they may overlap with the above description.

(1) A method of manufacturing a semiconductor device starts with provision of a semiconductor substrate having a main surface. A first p type epitaxial layer is formed over the main surface. A second p type epitaxial layer is formed so as to cover therewith the upper surface of the first p type epitaxial layer. A first photoelectric conversion element is formed in the second p type epitaxial layer. The first and second p type epitaxial layers are each made of silicon and the first p type epitaxial layer has a type impurity concentration higher than that of the second p type epitaxial layer.

(2) In the method of manufacturing a semiconductor device described in (1), the semiconductor substrate is a p type substrate and a defect density of the semiconductor substrate is higher than that of the second p type epitaxial layer.

(3) In the method of manufacturing a semiconductor device described in (1), the semiconductor substrate is a p type substrate. Upon providing the semiconductor substrate, extended defects are formed further in the semiconductor substrate. Upon forming the extended defects in the semiconductor substrate, a p type impurity is introduced into the semiconductor substrate so that the p type impurity concentration in the semiconductor substrate becomes higher than the p type impurity concentration in the second p type epitaxial layer. By heat treating the resulting semiconductor substrate to cause a reaction between the p type impurity in the semiconductor substrate and oxygen diffused into the semiconductor substrate, first extended defects are formed as the extended defects.

(4) In the method of manufacturing a semiconductor device described in (1), extended defects are formed further in the semiconductor substrate upon providing the semiconductor substrate. Upon forming the extended defects in the semiconductor substrate, an impurity element is introduced into the semiconductor substrate. By heat treating the semiconductor substrate having the impurity element introduced therein, second extended defects are formed as the extended defects.

(5) In the method of manufacturing a semiconductor device described in (1), the first p type epitaxial layer is formed over the main surface so that the first p type epitaxial layer is comprised of a plurality of layers. Upon forming the first p type epitaxial layer over the main surface, first extended defects are formed as the extended defects in a substrate adjacent layer, which is one of the layers configuring the first p type epitaxial layer and located on the side closest to the semiconductor substrate, as a result of reaction between a p type impurity in the substrate adjacent layer and oxygen diffused from the semiconductor substrate into the substrate adjacent layer.

(6) In the method of manufacturing a semiconductor device described in (5), upon forming the first p type epitaxial layer over the main surface, an oxygen concentration in the substrate adjacent layer, among the plurality of layers configuring the first p type epitaxial layer, is set higher than an oxygen concentration in the plurality of layers configuring the first p type epitaxial layer other than the substrate adjacent layer.

(7) A method of manufacturing a semiconductor device starts with provision of a semiconductor substrate having a main surface. An impurity is implanted into the semiconductor substrate to form a buried impurity layer. A p type epitaxial layer is formed over the buried impurity layer. A first photoelectric conversion element is formed in the p type epitaxial layer. The buried impurity layer and the p type epitaxial layer are each made of silicon and the buried impurity layer has a p type impurity concentration higher than that of the p type epitaxial layer.

Invention made by the present inventors has been described specifically based on some embodiments. It is needless to say that the invention is not limited to or by these embodiments but can be changed in various ways without departing from the scope of the invention.

What is claimed is:

1. A semiconductor device, comprising:
    a semiconductor substrate having a main surface;
    a first p type epitaxial layer formed over the main surface;
    a second p type epitaxial layer formed to cover an upper surface of the first p type epitaxial layer;
    a first photoelectric conversion element formed in the second p type epitaxial layer; and
    a first p type impurity region formed in the second p type epitaxial layer,
    wherein the first and second p type epitaxial layers are each made of silicon,
    wherein the first p type epitaxial layer has a p type impurity concentration higher than that of the second p type epitaxial layer, and
    wherein the first p type impurity region has a p type impurity concentration different than that in the second p type epitaxial layer.

2. The semiconductor device according to claim 1, further comprising:
    a second photoelectric conversion element for receiving a light having an average wavelength shorter than that of a light which the first photoelectric conversion element can receive,
    wherein the second photoelectric conversion element and the first photoelectric conversion element are arranged in a direction along the main surface.

3. The semiconductor device according to claim 2, wherein the first p type impurity region covers the upper surface of the first p type epitaxial layer below the second photoelectric conversion element and has a p type impurity concentration higher than that in the second p type epitaxial layer; and
    a second p type impurity region formed in the second p type epitaxial layer at a boundary portion between the first photoelectric conversion element and the second photoelectric conversion element and having a p type impurity concentration higher than that of the second p type epitaxial layer,
    wherein the first p type impurity region and the second p type impurity region are contiguous to each other.

4. The semiconductor device according to claim 3,
    wherein the second p type epitaxial layer has a trench, at the boundary portion between the first photoelectric conversion element and the second photoelectric conversion element, penetrating through the second p type epitaxial layer and reaching the first p type epitaxial layer, and
    wherein the second p type impurity region is a p type semiconductor layer formed in the trench.

5. The semiconductor device according to claim 4, further comprising:
    an insulating film formed over the p type semiconductor layer in the trench.

6. The semiconductor device according to claim 2,
    wherein the second p type epitaxial layer is arranged so as to cover the upper surface of the first p type epitaxial layer below both the first and second photoelectric conversion elements.

7. The semiconductor device according to claim 1,
    wherein the semiconductor substrate is a p type substrate.

8. The semiconductor device according to claim 7,
    wherein the semiconductor substrate has a defect density higher than that of the second p type epitaxial layer.

9. The semiconductor device according to claim 7,
    wherein the semiconductor substrate has a p type impurity concentration higher than that of the second p type epitaxial layer, and
    wherein the semiconductor substrate contains therein first extended defects formed as a result of a reaction between a p type impurity in the semiconductor substrate and oxygen diffused into the semiconductor substrate.

10. The semiconductor device according to claim 1, wherein the semiconductor substrate contains therein second extended defects formed by an impurity element introduced into the semiconductor substrate.

11. The semiconductor device according to claim 1, wherein the first p type epitaxial layer has a plurality of layers, and
wherein a substrate adjacent layer, which is one of the layers configuring the first p type epitaxial layer and is arranged on the side closest to the semiconductor substrate has first extended defects formed by a reaction between a p type impurity in the substrate adjacent layer and oxygen diffused into the substrate adjacent layer.

12. The semiconductor device according to claim 11, wherein an oxygen concentration in the substrate adjacent layer which is one of the layers configuring the first p type epitaxial layer is higher than an oxygen concentration of the layers configuring the first p type epitaxial layer other than the substrate adjacent layer.

13. A semiconductor device, comprising:
a semiconductor substrate having a main surface;
a buried impurity layer formed in the semiconductor substrate;
a p type epitaxial layer formed over the buried impurity layer; and
a first photoelectric conversion element formed in the p type epitaxial layer,
wherein the buried impurity layer and the p type epitaxial layer each have silicon, and
the buried impurity layer has a p type impurity concentration higher than that of the p type epitaxial layer.

14. A method of manufacturing a semiconductor device, comprising the steps of:
providing a semiconductor substrate having a main surface;
forming a first p type epitaxial layer over the main surface;
forming a second p type epitaxial layer so as to cover an upper surface of the first p type epitaxial layer;
forming a first photoelectric conversion element in the second p type epitaxial layer; and
forming a first p type impurity region in the second p type epitaxial layer,
wherein the first and second p type epitaxial layers each have silicon,
wherein the first p type epitaxial layer has a p type impurity concentration higher than that of the second p type epitaxial layer, and
wherein the first p type impurity region has a p type impurity concentration different than that in the second p type epitaxial layer.

15. The method of manufacturing a semiconductor device according to claim 14, further comprising the step of:
forming a second photoelectric conversion element for receiving a light having an average wavelength shorter than that of a light which the first photoelectric conversion element can receive,
wherein the second photoelectric conversion element and the first photoelectric conversion element are arranged in a direction along the main surface.

16. The method of manufacturing a semiconductor device according to claim 15,
wherein the first p type impurity region is formed to cover the upper surface of the first p type epitaxial layer below a region in which the second photoelectric conversion element is to be formed, the first p type impurity region having a p type impurity concentration higher than that in the second p type epitaxial layer,
wherein the method further comprises the step of forming a second p type impurity region in the second p type epitaxial layer at a boundary portion between a region in which the first photoelectric conversion element is to be formed and the region in which the second photoelectric conversion element is to be formed, the second p type impurity region having a p type impurity concentration higher than that of the second p type epitaxial layer, and
wherein the first p type impurity region and the second p type impurity region are contiguous to each other.

17. The method of manufacturing a semiconductor device according to claim 16,
wherein the step of forming the second p type impurity region comprises the steps of:
forming a trench penetrating through the second p type epitaxial layer so as to reach the first p type epitaxial layer at the boundary portion of the second p type epitaxial layer between the region in which the first photoelectric conversion element is to be formed and the region in which the second photoelectric conversion element is to be formed; and
forming a p type semiconductor layer as the second p type impurity region in the trench.

18. The method of manufacturing a semiconductor device according to claim 17, further comprising the step of:
forming an insulating film over the p type semiconductor layer in the trench.

19. The method of manufacturing a semiconductor device according to claim 15,
wherein in the step of forming the second p type epitaxial layer, the second p type epitaxial layer is formed so as to cover the upper surface of the first p type epitaxial layer below both regions in which the first and second photoelectric conversion elements are to be formed, respectively.

20. The method of manufacturing a semiconductor device according to claim 14,
wherein the semiconductor substrate is a p type substrate.

* * * * *